(12) United States Patent
Shiratsuchi et al.

(10) Patent No.: US 7,648,256 B2
(45) Date of Patent: Jan. 19, 2010

(54) LIGHTING SYSTEM HAVING LENSES FOR LIGHT SOURCES EMITTING RAYS AT DIFFERENT WAVELENGTHS

(75) Inventors: Masataka Shiratsuchi, Kawasaki (JP); Masatoshi Hirono, Tokyo (JP); Masahiro Toda, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/538,894

(22) Filed: Oct. 5, 2006

(65) Prior Publication Data

US 2007/0147041 A1  Jun. 28, 2007

(30) Foreign Application Priority Data

Oct. 14, 2005  (JP) ............................ P2005-300639
Sep. 25, 2006  (JP) ............................ P2006-258632

(51) Int. Cl.
*F21S 8/00* (2006.01)
(52) U.S. Cl. ................... 362/268; 362/230; 359/622
(58) Field of Classification Search ................ 362/268, 362/297, 299–305, 308–311, 331–340, 230, 362/231, 240, 241, 244; 359/620–624, 619–629
See application file for complete search history.

(56) References Cited

U.S. PATENT DOCUMENTS

| | | | | |
|---|---|---|---|---|
| 2,253,409 A | * | 8/1941 | Yost et al. | 362/268 |
| 4,374,609 A | * | 2/1983 | Lange | 359/455 |
| 4,542,448 A | * | 9/1985 | Yamai et al. | 362/268 |
| 4,654,761 A | * | 3/1987 | Walsh | 362/521 |
| 4,733,335 A | * | 3/1988 | Serizawa et al. | 362/503 |
| 4,752,116 A | * | 6/1988 | Sekiguchi | 359/457 |
| 5,757,557 A | | 5/1998 | Medvedev et al. | |
| 6,402,347 B1 | * | 6/2002 | Maas et al. | 362/294 |
| 6,509,840 B2 | * | 1/2003 | Martineau | 340/815.45 |
| 6,616,299 B2 | * | 9/2003 | Martineau | 362/244 |
| 6,896,381 B2 | | 5/2005 | Benitez et al. | |
| 6,960,007 B2 | * | 11/2005 | Ishida et al. | 362/538 |
| 7,116,485 B2 | * | 10/2006 | Po-Hung et al. | 359/626 |
| 7,237,924 B2 | * | 7/2007 | Martineau et al. | 362/231 |
| 2002/0080501 A1 | * | 6/2002 | Kawae et al. | 359/799 |
| 2005/0281029 A1 | * | 12/2005 | Inamoto | 362/234 |
| 2006/0056185 A1 | | 3/2006 | Morino et al. | |

FOREIGN PATENT DOCUMENTS

CN  1499125 A  5/2004
JP  61-147585  7/1986

(Continued)

OTHER PUBLICATIONS

Chinese Office Action dated Dec. 19, 2008 corresponding to U.S. Appl. No. 11/538,894, filed Oct. 5, 2006.

*Primary Examiner*—Gunyoung T Lee
(74) *Attorney, Agent, or Firm*—Turocy & Watson, LLP

(57) ABSTRACT

A lighting system includes a first light source emitting first light rays; a second light source emitting second light rays, a first lens side which refracts the first and second light rays and collimates the refracted light rays; a second lens side which includes a plurality of first lenticules and refracts the first and second light rays; and a third lens side which includes a plurality of second lenticules and refracts the first and second light rays refracted by the second lens side.

8 Claims, 21 Drawing Sheets

FOREIGN PATENT DOCUMENTS

| | | |
|---|---|---|
| JP | 05-152609 | 6/1993 |
| JP | 07-099345 | 4/1995 |
| JP | 10-190065 | 7/1998 |
| JP | 2001-264859 | 9/2001 |
| JP | 2003-281909 | 10/2003 |
| JP | 2004-088007 | 3/2004 |
| JP | 2005-190954 | 7/2005 |
| JP | 2005-276644 | 10/2005 |

* cited by examiner

LIGHTING SYSTEM HAVING LENSES FOR LIGHT SOURCES EMITTING RAYS AT DIFFERENT WAVELENGTHS

CROSS REFERENCE TO RELATED APPLICATIONS

This application is based upon and claims the benefit of priority from the prior JPApplications No. 2005-300639 filed on Oct. 14, 2005, and No. 2006-258632 filed on Sep. 25, 2006, the entire contents of which are incorporated herein by reference.

BACKGROUND OF THE INVENTION

1. Field of the Invention

This invention relates to a lighting system, and in particular to a lighting system including semiconductor light emitting elements and an optical unit which controls the light distribution. More specifically, the invention relates to a lighting system which includes light emitting diodes and an optical unit controlling distribution of light rays, and which is effectively applicable to illumination of retail premises, business premises, residences, and so on.

2. Description of the Related Art

In a lighting system using white LEDs (light emitting diodes) as a light source, a bombshell-shaped lens, a combined total-reflection lens or a fly-eye lens are usually used to control distribution of light rays.

Bombshell-shaped lenses are widely used for indicators. For instance, JP Publication No. 3065263 (Reference 1) describes a bombshell-shaped lens which is made of plastics and is constituted by an oval or circular part combined with a cylindrical part. Referring to FIG. 25 of the accompanying drawings, a lighting system 100 (an LED lamp) is constituted by a light emitting diode chip 102 embedded in a bombshell-shaped lens 101. The light emitting diode chip 102 is mounted in a lead 103, and one of main electrode terminals of the light emitting diode chip 102 is electrically connected to the lead 103. The other main electrode terminal of the light emitting diode chip 102 is electrically connected to a lead 104 using a wire 105. The bombshell-shaped lens 101 gathers most of light rays emitted by the light emitting diode chip 102 (light source), and leads the light rays forwardly in a narrow range (in an illuminating direction D1), thereby realizing a lighting system 100 which assures narrow light distribution.

With the lighting system 100, it is impossible to efficiently use light rays emitted in a direction D2 which extends round the illuminating direction D1 of the light emitting diode chip 2. Such light rays are of no use, which will affect efficient use of light rays emitted by the lighting system 100. Further, with the foregoing lighting system 100, the light emitting diode chip 102 is embedded in the plastic bombshell-shaped lens 101, so that heat generated therein cannot be effectively radiated. The lighting system 100 consumes a lot of electric power. Therefore, it is very difficult to use diodes which assure a large light intensity but produce a lot of heat. For the foregoing reasons, the lighting system 100 including the bombshell-shaped lens 101 seems unfavorable to applications in retail premises, business premise, residences and so on.

The following lenses assure large light intensities, and are being used in place of the bombshell-shaped lens 101 as described in: JP Publication No. H4-36588 (Reference 2); JP Laid-Open Publication No. 2003-281909 (Reference 3); U.S. Pat. No. 5,757,557 (Reference 4); U.S. Pat. No. 6,896,381 (Reference 5); JP Laid-Open Publication No. 2005-190954 (Reference 6); JP Laid-Open Publication No. H5-152609 (Reference 7); and JP Laid-Open Publication No. H7-99345 (Reference 8). References 2 to 4 describe combined total reflection lenses while Reference 5 describes a method of collimating light rays originated by the light emitting diode using a single lens, a single mirror or the like. Referring to FIG. 26, a lighting system 200 includes a combined total reflection lens 201 which is mounted on a light emitting diode chip 202 placed on a substrate 203. In the lighting system 200, light rays originated by the light emitting diode chip 202 in the illuminating direction D1 are collimated by a refracting lens. Light rays originated in the illuminating direction D2 which is around the illuminating direction D1 are reflected by the combined total reflection surface in the illuminating direction D1. Therefore, most of light rays emitted by the light emitting diode chip 202 in the whole direction are collimated in the illuminating direction D1, so that light rays can be used very efficiently. Further, heat generated in response to the light emission of the light emitting diode chip 202 can be radiated via the substrate 203, which enables the use of the light emitting diodes assuring large light intensities, and application to lighting systems requiring large light intensities.

Reference 6 describes a lighting system including a fly-eye lens, in which light rays can be illuminated onto a specific area. The lighting system can be thinned as a whole.

However, it seems that the following problems remain to be solved in the lighting system 200 including the combined total reflection lens 201. Generally speaking, a lighting system like the lighting system 200 uses a critical optic system which projects light rays in an infinite direction. If there is a color shade or luminance shade on the light source, it may be projected as it is onto an illumination target. A white light emitting diode commonly emits light rays using the following methods.

(1) As described in References 7 and 8, a yellow fluorescent object is placed around a blue light emitting diode. Some blue light rays are converted into yellow light rays, so that the blue and yellow light rays are combined to produce white light rays.

(2) A red light emitting diode, a green light emitting diode and a blue light emitting diode originate light rays, so that red, green and blue light rays are combined to produce white light rays.

(3) RGB fluorescent layers are placed around a near ultraviolet light emitting diode in order that near ultraviolet light rays are converted into white light rays via the fluorescent layers.

The method (1) assures light emitting efficiency which is approximately 30% higher than in the methods (2) and (3), and is practically preferable to lighting systems in retail premises, business premises, residences and so on where large light intensities are required. However, if the lighting system 200 using the combined total reflection lens 201 adopts the method (1), color shades or luminance shades of the blue light rays originated by the light emitting diode chip 202 and the yellow light rays originated by the yellow fluorescent substance are projected on the illumination target as they are via the combined total reflection lens 201. Therefore, it is very difficult to produce uniform white light rays. The method (2) also suffers from this problem.

Further, the combined total reflection lens 201 has a three-dimensional shape in which a refractive surface and a reflective surface are combined, and which requires high manufacturing cost (molding cost). The lighting system 200 will inevitably become expensive. Further, the combined total reflection lens 201 has a complicated three-dimensional structure, and is not preferable to be manufactured in the shape of a module.

Still further, the light system using the fly-eye lens includes a collimating lens between the light emitting diode and the fly-eye lens. The collimating lens collimates light rays originated from the light emitting diode, and the collimated light rays are designed to have a distribution angle of below 30 degrees. However, since light rays outside the light distribution angle are not gathered and lost, they cannot be sufficiently efficiently utilized.

Since the fly-eye lens has a minutely bumpy surface, it may be easily contaminated, which will adversely affect efficient use of light rays.

This invention has been contemplated in order to overcome problems of the related art, and is intended to provide a lighting system which can reduce color shades.

A further object of the invention is to provide a lighting system which can promote efficient use of light rays as well as reduce color shades

SUMMARY OF THE INVENTION

In accordance with an aspect of the embodiment of the invention, a lighting system includes a first light source emitting first light rays; a second light source having a light emitting point partly displaced from the first light source and emitting second light rays whose wavelength differs from a wavelength of the first light rays; a first lens side which refracts and collimates the first and second light rays; a second lens side which includes a plurality of juxtaposed first lenticules and refracts the first and second light rays; and a third lens side which includes a plurality of juxtaposed second lenticules and refracts the first and second light rays refracted by the second lens side. In the lighting system, the second lenticules correspond to the first lenticules on the one-to-one basis; the first lenticules collect the first and second light rays on the second lenticules; and a part of a first illumination area of the first and second light rays refracted by one first lenticule and one second lenticule overlaps with a part of a second illumination area of the first and second light rays refracted by another first lenticule and another second lenticule.

In accordance with another aspect of the embodiment, a lighting system includes a light emitting diode emitting blue light rays; a fluorescent substance receiving the blue light rays and emitting yellow light rays; a Fresnel lens refracting and collimating the blue and yellow light rays; a first fly-eye lens refracting the blue and yellow light rays passing through the Fresnel lens; and a second fly-eye lens refracting the blue and yellow light rays passing through the first fly-eye lens.

BRIEF DESCRIPTION OF THE SEVERAL VIEWS OF THE DRAWINGS

Like or corresponding parts are denoted by like or corresponding reference numerals.

DETAILED DESCRIPTION OF THE INVENTION

Figure 1:
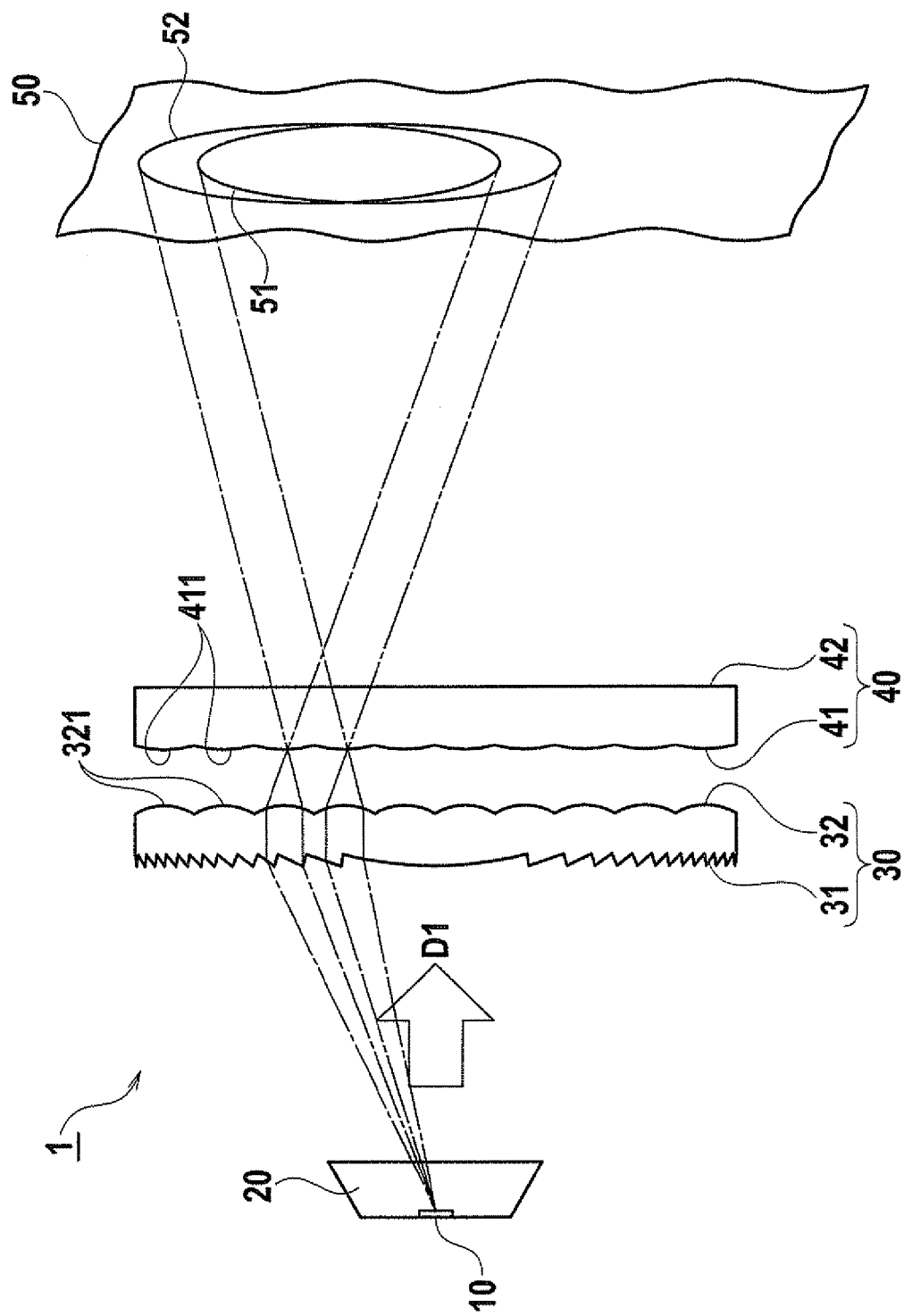
FIG. 1 is a schematic view of a lighting system according to a first embodiment of the invention.

The invention will be described in detail with reference to embodiments shown in the drawings.

FIRST EMBODIMENT

[Structure of Lighting System]

In a first embodiment, a lighting system 1 includes a semiconductor light emitting element 10 (a first light source), a fluorescent object 20 (a second light source), a first lens 30, and a second lens 40. The first lens includes a first lens side 31 and a second lens side 32. The second lens 40 includes a third lens side 41 and a fourth lens side 42. The semiconductor light emitting element 10 originates first light rays. The fluorescent object 20 extends over a light emitting area of the semiconductor light emitting element 10, receives the first light rays, and produces second light rays whose wavelength differs from a wavelength of the first light rays. The first lens side 31 collimates the first and second light rays. The second lens side 32 includes a plurality of first lenticules 321 which refract the first and second light rays refracted by the first lens side 31, and are juxtaposed. The third lens side 41 includes a plurality of second lenticules 411 which refract the first light and second light rays refracted by the second lens side 32, face with the first lenticules 321, and are juxtaposed. In the lighting system 1, the first lenticules 321 of the second lens side 32 collect the first and second light rays on the second lenticules 411 of the third lens side 41. Further, a part of a first illumination target of the first and second light rays refracted by one of the first lenticules 321 and by one of the second lenticules 411 overlaps with an illumination area of the first and second light rays refracted by one of the first lenticules 321 and one of the second lenticules 411. The first and second light rays originated by the lighting system 1 are projected in infinity onto an illumination target 50 and the second illumination target 52.

The term "in infinity" represents a limit point where the first and second light rays originated by the light source are collimated. Actually, the limit point is sufficiently far from the lighting system 1, e.g., on a desk, floor, wall or the like if the lighting system 1 is installed on a ceiling.

Figure 6:
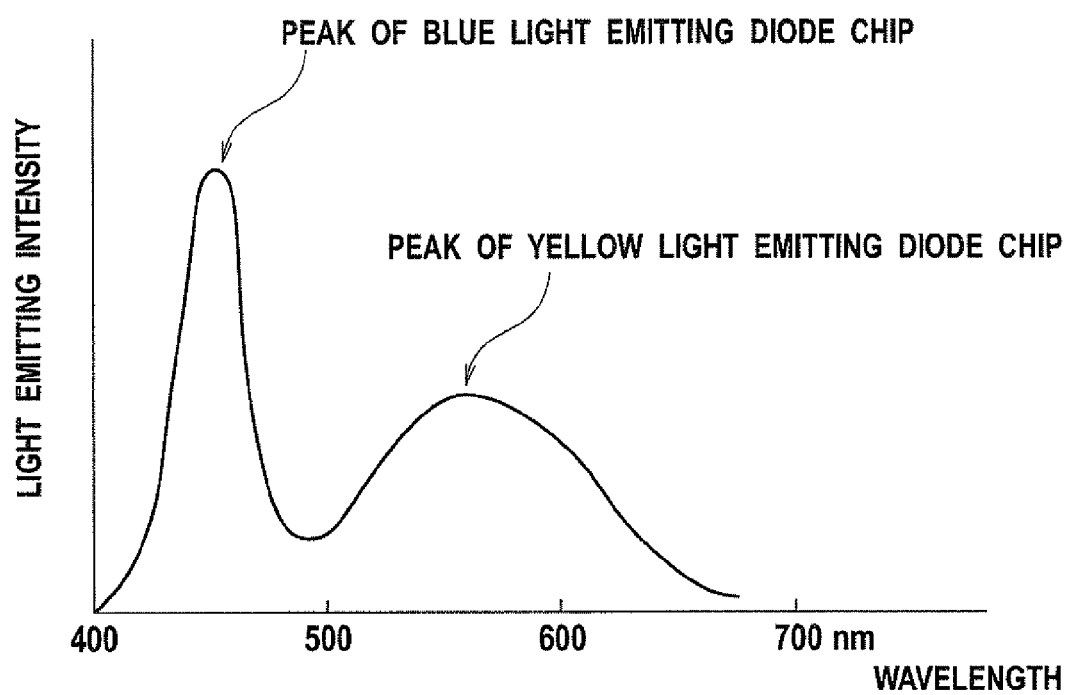
FIG. 6 is a graph showing the relationship between wavelengths and light emitting intensities of the semiconductor light emitting element and the fluorescent object.

The lighting system 1 is designed to be applicable to illuminating retail premises, business premises, residences, and so on which require large light intensities. Therefore, the lighting system 1 includes the semiconductor light emitting element 10, and the fluorescent object 20 The semiconductor light emitting element 10 produces the blue light rays (whose wavelength is 400 nm to 500 nm). The fluorescent object 20 converts a part of the blue light rays into yellow light rays (whose wavelength is 500 nm to 700 nm, and which differs from the wavelength of the blue light rays). The blue and yellow light rays are mixed to produce white light rays. In this case, white light rays can be efficiently produced compared to the other light producing methods. FIG. 6 shows the relationship between a light emitting intensity and a wavelength of the blue and the yellow light rays. The abscissa denotes the wavelength while the ordinate denotes the light emitting intensity. Alternatively, the fluorescent object 20 may produce second light rays whose wavelength is a combination of the yellow and red light rays.

The semiconductor light emitting element 10 is preferably a blue light emitting diode (a semiconductor chip) in the first embodiment. Specifically, a blue light emitting diode mainly made of gallium nitride (GaN), zinc oxide (ZnO), or zinc selenide (ZnSe) is usable.

Figure 2:
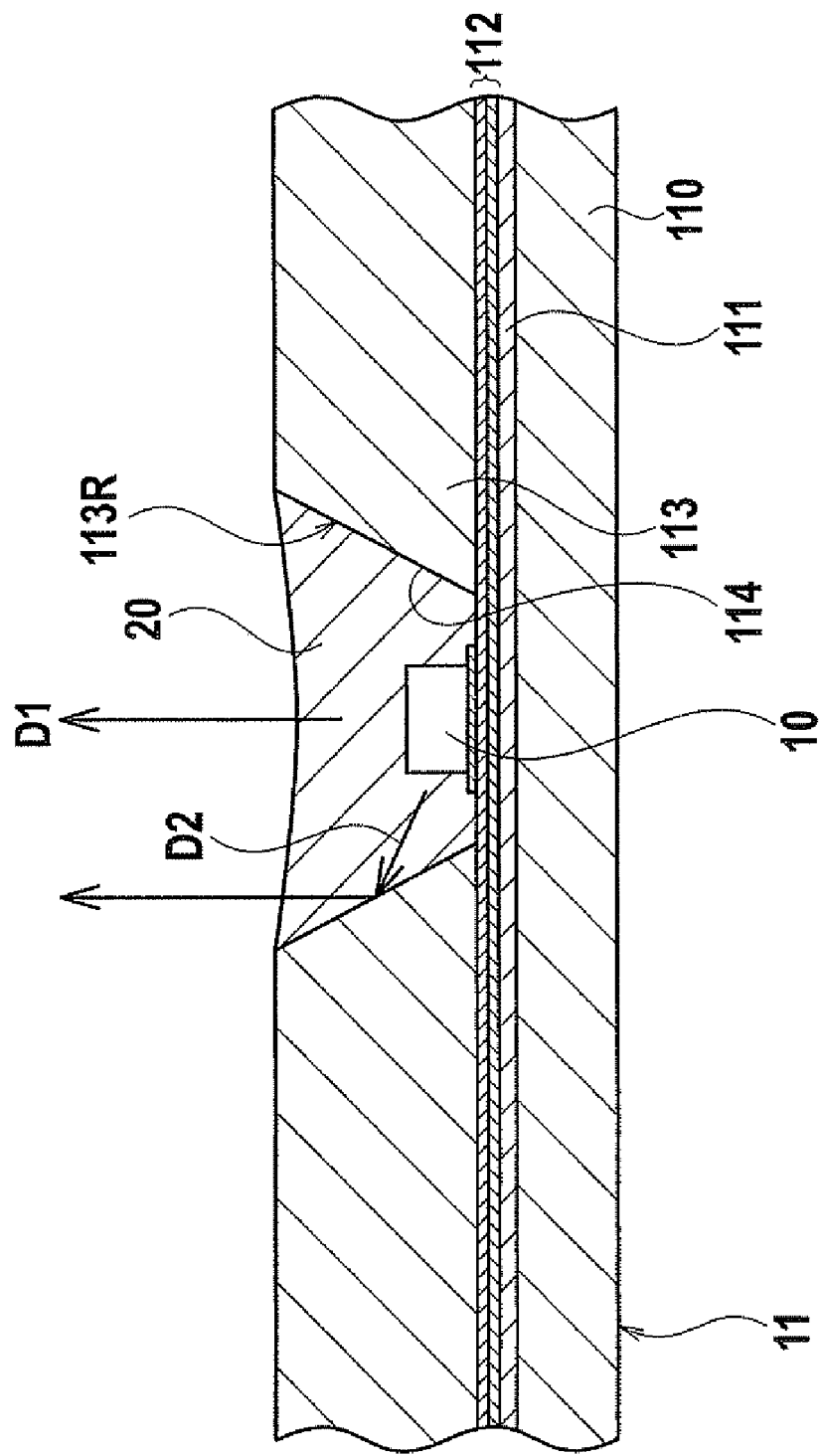
FIG. 2 is an enlarged cross section of a substrate on which a semiconductor light emitting element and a fluorescent object are mounted.

As shown in FIG. 2, the semiconductor light emitting element 10 is mounted on the substrate 11. The fluorescent object 20 extends over top and side surfaces of the semiconductor light emitting element 10 in order to house the semiconductor light emitting element 10 therein. The substrate 11 is constituted by a base 110, an insulator 111 on the base 110, a circuit pattern 112 on the insulator 111, a reflector 113 having a reflective surface 113R, and a recess 114 defined by the reflective surface 113R and a bottom defined by a part (specifically, a part of surface of the circuit pattern 112) of the base 110.

The base 110 of the substrate 11 is made of a material having high thermal conductivity, e.g., an aluminum substrate, in order to effectively radiate heat generated in response to the light emission of the semiconductor light emitting element 10. Alternatively, the base 110 may be made of a material having high thermal conductivity such as a glass epoxy resin, an engineering plastics, aluminum nitride and so on.

The insulator 111 prevents electric short circuits between the circuit pattern 112 and the base 110, and is made of a silicon oxide film or a silicon nitride film which can assure a sufficient withstand voltage even if the semiconductor light emitting element 10 is thinned in order to reduce thermal resistance between the circuit pattern 112 to the base 110.

Although a layout of the circuit pattern 112 is not shown, the circuit pattern 112 includes a first wiring and a second wiring. The first wiring is electrically connected to a main electrode terminal on the front surface of the semiconductor light emitting element 10. The second wiring is electrically connected via a bond to a main electrode terminal on a rear surface of the semiconductor light emitting element 10. In this embodiment, the circuit pattern 112 is constituted by three metal layers. A bottom layer of the circuit pattern 112 is directly deposited on the insulator 111, and is made of a material having high electric conductivity and high thermal conductivity, e.g., copper foil. An intermediate layer of the circuit pattern 112 is placed on the copper foil, and is made of a nickel-plated substance having high reflectance. A top layer is placed on the intermediate layer, and is a copper-plated substance having high electric conductivity and thermal conductivity, and easy to be bonded onto the rear surface of the semiconductor light emitting element 10. Alternatively, the circuit pattern 111 may be made of noble metal such as gold, silver or the like.

The reflector 113 defines the recess 114 in which the semiconductor light emitting element 10 is placed, and has a reflective surface 113R, which reflects light rays (originated from the semiconductor light emitting element 10 in the direction D2) in the illuminating direction D1 vertical to the surface of the substrate 11. The reflective surface 113R and the recess 114 can be easily molded, and has high light reflection energy, and is made of such plastics as polybutyrene terephthalate (PBT), polyearbonate (PC), or the like.

Figure 3A:
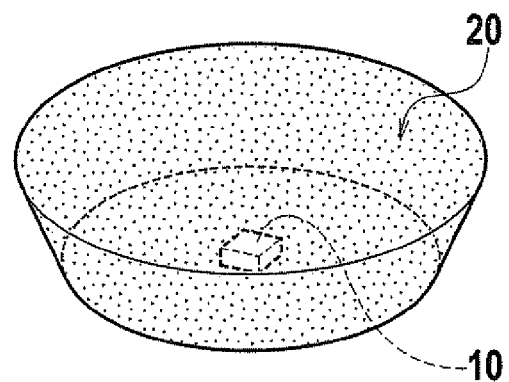
FIG. 3A is a perspective view of the fluorescent object of the lighting system in FIG. 1.
Figure 3B:
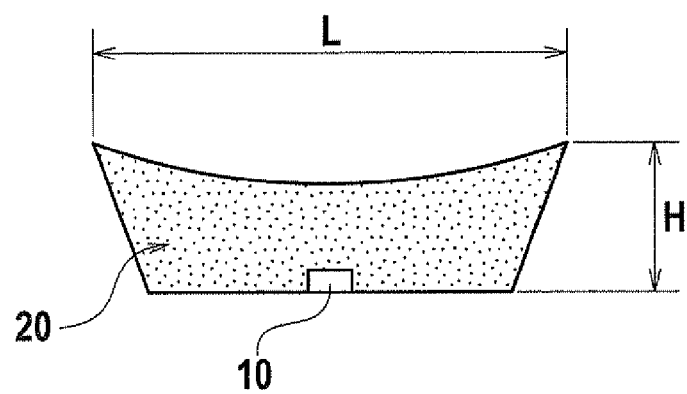
FIG. 3B is a cross section of the fluorescent object.
Figure 3C:
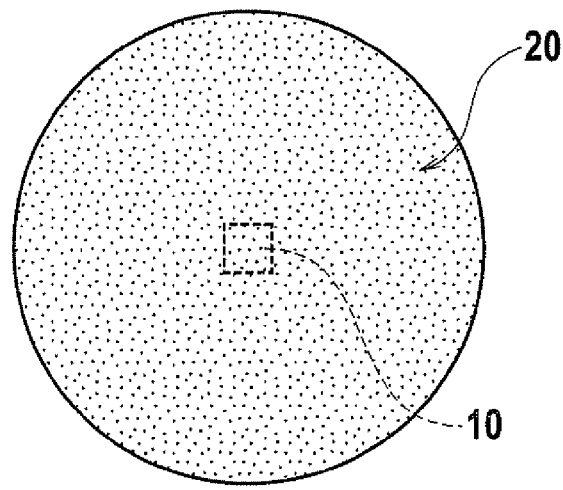
FIG. 3C is a top plan view of the fluorescent object.

The fluorescent object 20 is made of yttrium aluminum garnet (YAG) or the like, which is dispersed in such transparent plastics as a silicone resin, epoxy resin, modified epoxy resin or the like, is filled in the recess 114 and is cured therein. Referring to FIG. 3A to FIG. 3C, the semiconductor light emitting element 10 has a size of 0.3 mm to 1.0 mm (i.e., one side of the light emitting diode chip). The fluorescent object 20 is in the shape of an inverted and truncated cone, which has a circular top with a diameter L of 2.5 mm to 3.5 mm, and a wall with a height of 0.5 mm to 1.0 mm.

Referring back to FIG. 1, the first lens side 31 and the second lens side 32 serve as a light distribution control lens, i.e., constitute an optical unit, and are positioned on opposite sides of the first lens 30. The third lens side 41 and the fourth lens side 42 are opposite surfaces of the second lens 40.

Figure 4:
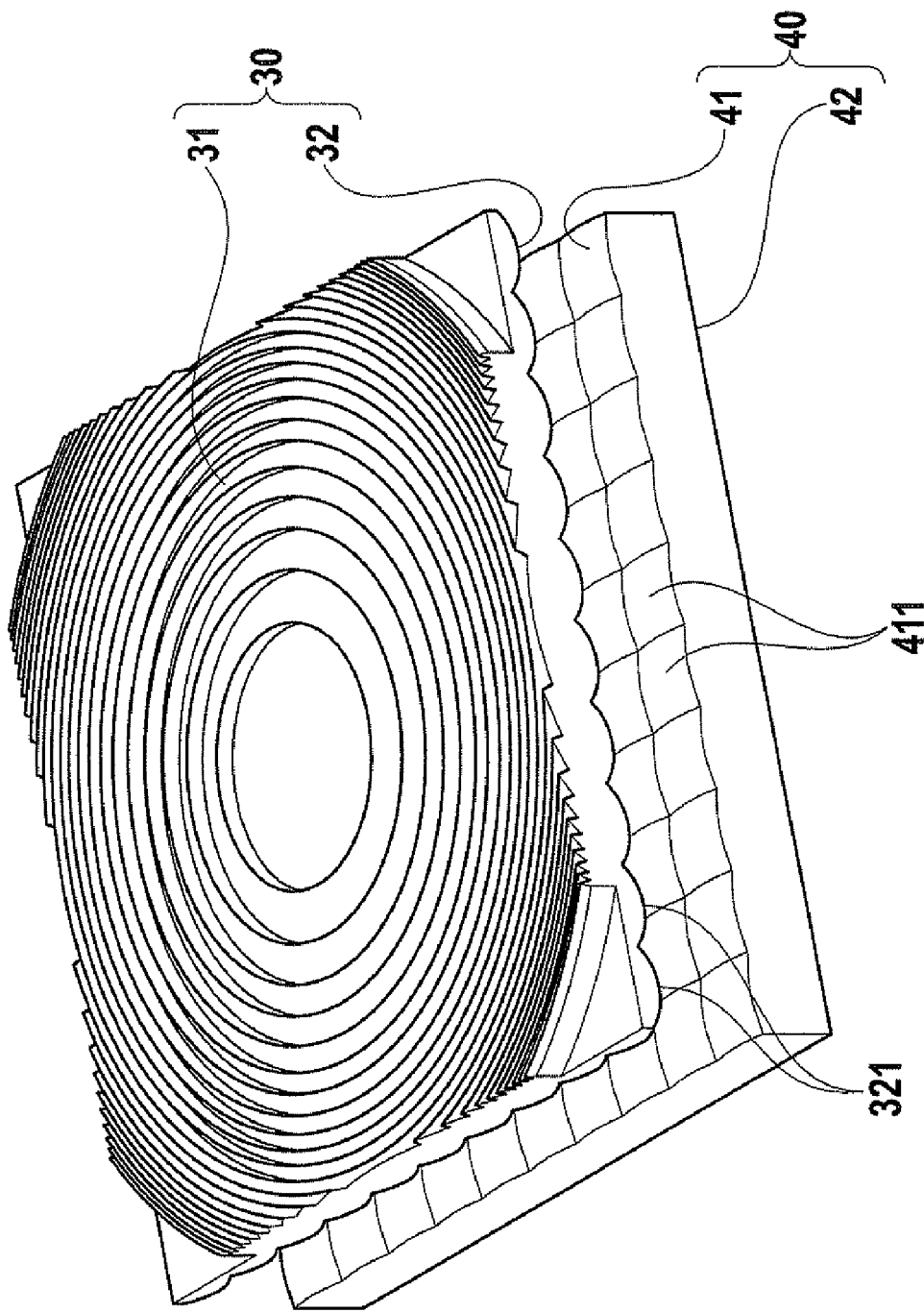
FIG. 4 is a perspective view of a light distribution control lens (optical lens) of the lighting system in FIG. 1.
Figure 5:
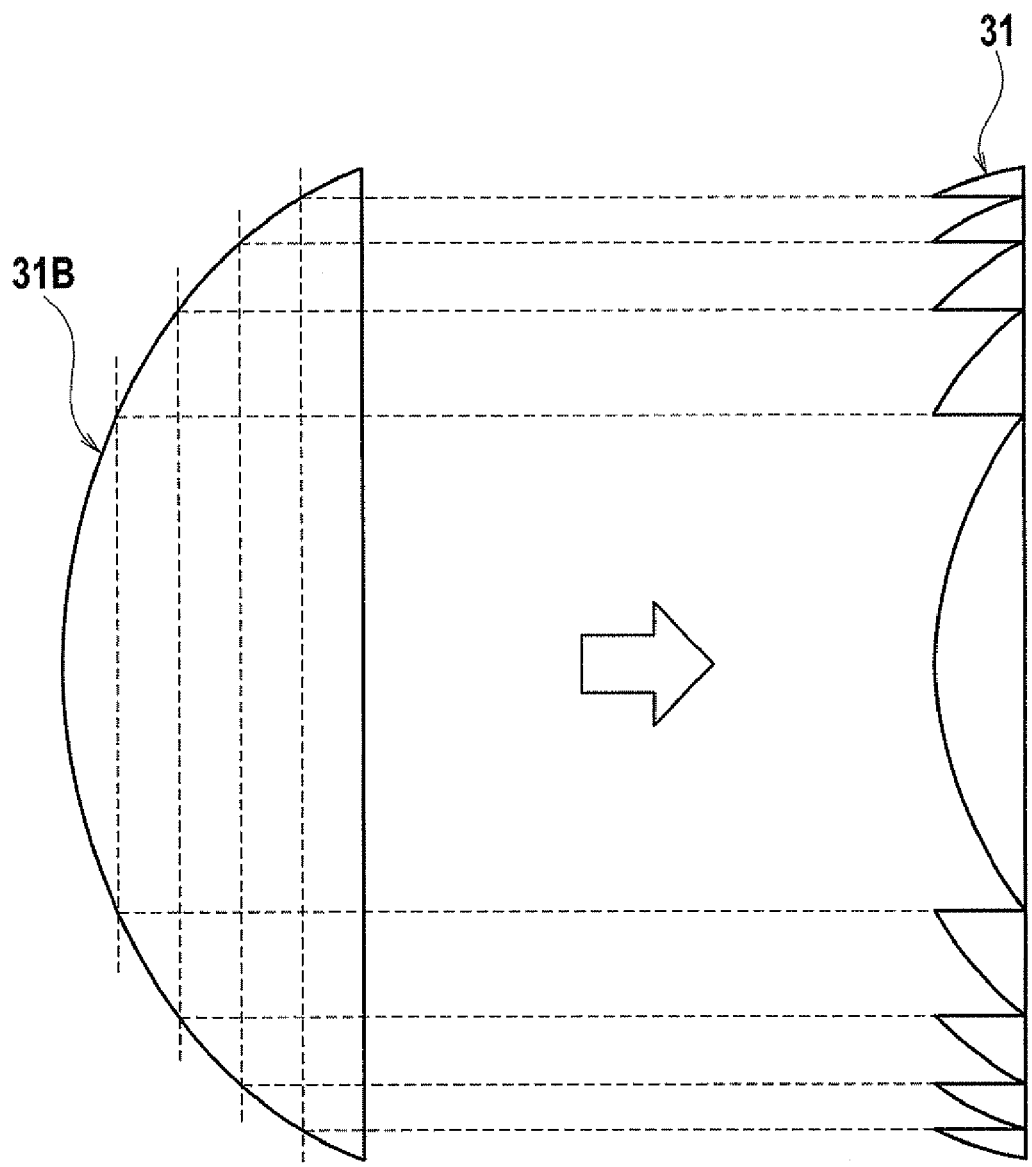
FIG. 5 is a cross section showing how to make a Fresnel lens as the light distribution control lens.

The first lens side 31 is placed to face with the semiconductor light emitting element 10, and is curved outward toward the semiconductor light emitting element 10, and serves a convex lens. The first lens side 31 gathers the first and second light rays from the semiconductor light emitting element 10 and the fluorescent object 20, and collimates the collected light rays in the illuminating direction D1. As shown in FIG. 1 and FIG. 4, the first lens side 31 is in the shape of a Fresnel lens having stepped concentric circles 31B, and being thinner and flatter than a conventional lens of equivalent focal length as shown in FIG. 5. This makes the first lens 30 thinner.

The second lens side 32 is opposite to the first lens side 31, and includes the first lenticules 321 which are curved outward toward the third lens side 41 of the second lens 40. In short, the second lens side 32 is positioned between the first lens side 31 and the third lens side 41, and faces with both of the first lens side 31 and the third lens side 41. The second lens side 32 collects the first and second light rays which are refracted and collimated by the first lens side 31, so that the light rays from the light source are focused on the third lens side 41. As shown in FIG. 1 and FIG. 4, the second lens side 32 is a fly-eye lens in which the first lenticules 321 are arranged in the shape of a matrix, thereby making an aperture ratio smaller, and thinning the first lens 30.

The first lens 30 is made of such plastics as acrylic or polycarbonate and so on, which has high optical transmissivity and is easy to be molded.

The third lens side 41 is positioned on a part of the second lens 40, which is opposite to the fourth lens side 42. The second lenticules 411 are curved outward toward the second lens sides 32. As shown in FIG. 1, the first and second light rays refracted and collected by the second lens side 32 are projected in an infinite direction toward the illumination target 50. In other words, the third lens side 41 is equivalent to a capacitor lens, and controls the light distribution. Referring to FIG. 1 and FIG. 4, the third lens side 41 is a fly-eye lens in which the second lenticules 411 are arranged in the shape of a matrix. Each second lenticule 411 corresponds to each first lenticule 321. The first lenticules 321 are designed to have a small curvature radius in order to focus the light rays from the light source in a short distance to the second lenticules 411. On the contrary, the second lenticules 411 are designed to have a curvature radius larger than that of the first lenticules 321 in order to transmit the light rays from the light source in infinity.

The fourth lens side 42 is opposite to the third lens side 41, and faces with the illumination target 50. The fourth lens side 42 is flat as shown in FIG. 1 and FIG. 4. Since the flat fourth lens side 42 is slow to be contaminated, it can prevent the lighting system 1 from lowering its optical efficiency even if it is used for a long time. Further, the fourth lens side 42 may processed to promote light diffusion if necessary. Specifically, the fourth lens side 42 may be roughened, be covered with a coating material, or be applied a light-diffusing lamination film. The foregoing process enhances diffusion of the first and second light rays which are incident on the fourth lens side 42.

The third lens side 41 and the fourth lens side 42 are made of such plastics as acrylic or polycarbonate and so on which have high light transmissivity.

[Light Distribution Control of Lighting System]

Figure 26:
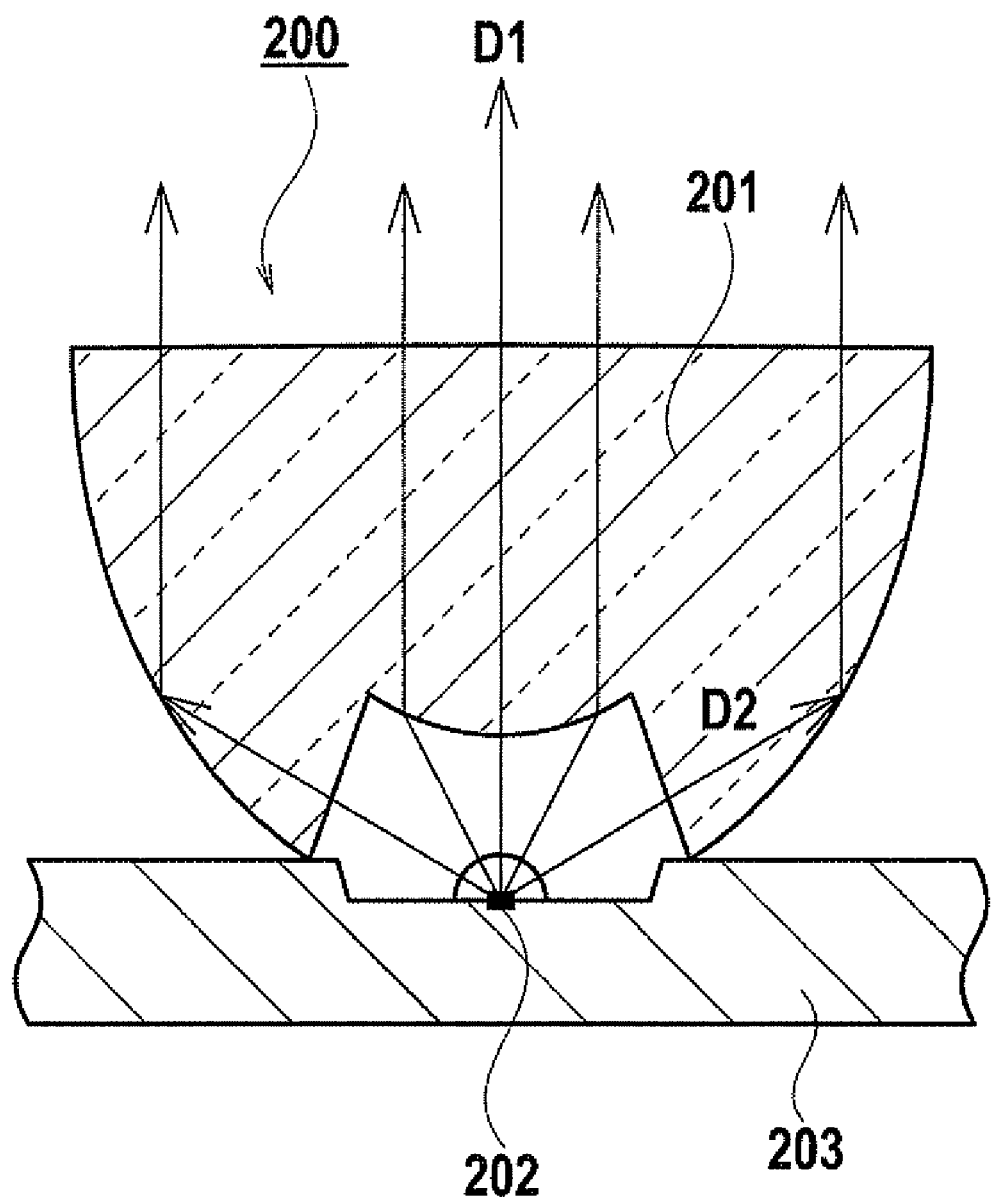
FIG. 26 shows a structure of a lighting system having a combined reflection lens in another example of the related art.

The distribution of light rays is controlled in the lighting system 1 as described hereinafter. First of all, the lighting system 200 of the related art will be described with reference to FIG. 26. The lighting system 200 includes a combined total reflection lens 201, and emits white light rays using a blue light emitting diode 202 and a yellow fluorescent object. The lighting system 200 assures high light utilization efficiency.

Figure 7:
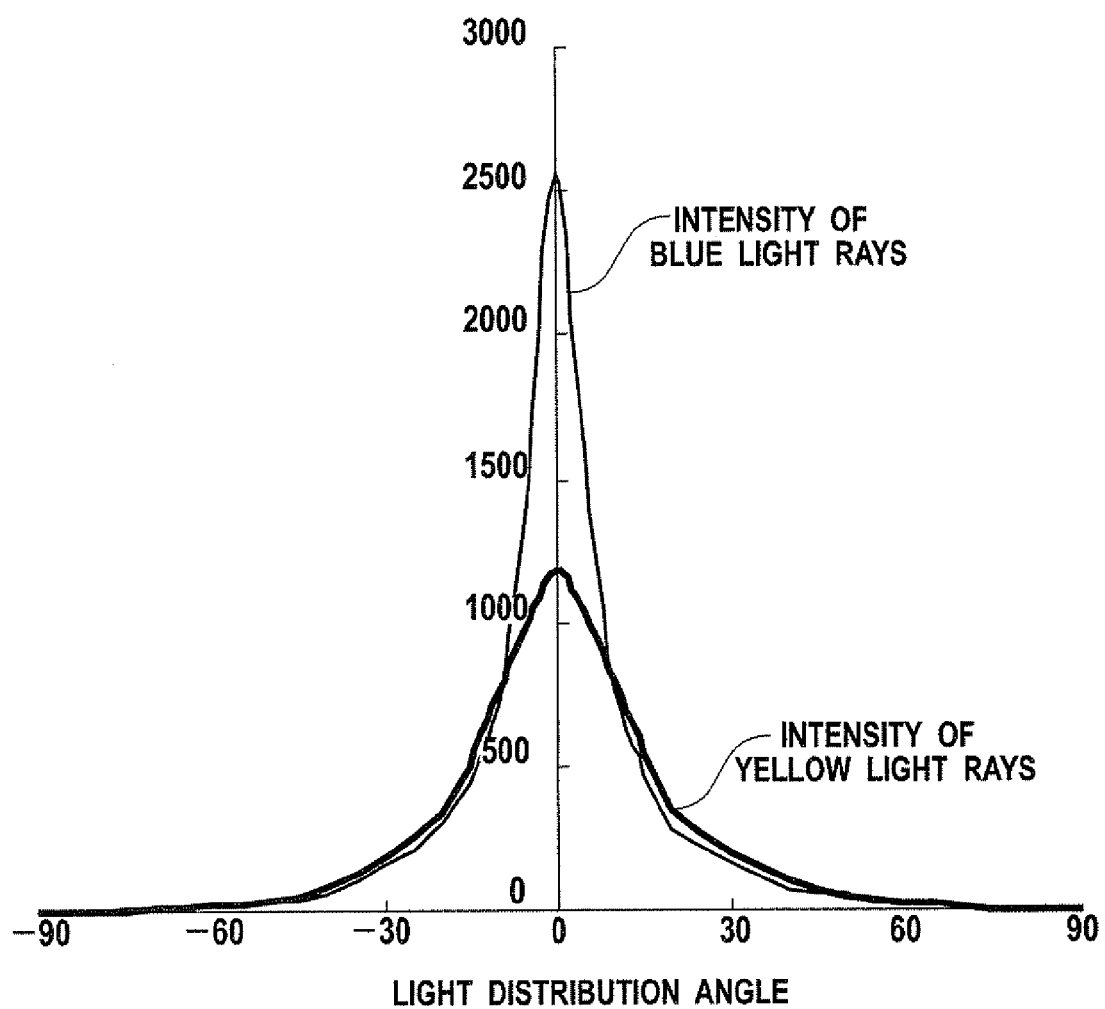
FIG. 7 is a graph showing light distribution of a comparison example of the related art.

FIG. 7 shows the distribution of light rays emitted by the lighting system 200. The light intensity of the blue light rays is strong at a narrow light distribution angle near the center, and the blue light rays become yellowish at wide distribution angles near the periphery of the blue light rays. The intensity of the blue light rays is approximately two to four times strong compared with the intensity of the yellow light rays, depending upon a lens shape. When the light rays having the foregoing light distribution are controlled using the combined total reflection lens 201 of critical illumination type, the light rays will become bluish in a specific direction, and clear color shades or brightness shades will appear on the illumination target.

The foregoing phenomenon is caused because the blue light emitting diode 202 is much smaller than the fluorescent object 20, i.e., the first light rays (blue light rays) and the second light rays (yellow light rays) are emitted at different positions.

On the contrary, in the lighting system 1 of the first embodiment, the first light rays (blue light rays) emitted by the semiconductor light emitting element 10 and the second light rays (yellow light rays) emitted by the fluorescent object 20 in response to the first light rays are refracted and collimated by the first lens side 31 (Fresnel lens). The collimated first and second light rays are illuminated onto the whole area of the second lens side 32 (fly-eye lens). The second lens side 32 refracts and collects the collimated light rays, and focuses the light rays of the light source on or around the third lens side 41 (fly-eye lens). The third lens side 41 casts in infinity slightly blurred light rays on the first lenticules 321 at the second lens side 32. Therefore, the first and the second light rays can be substantially equally distributed onto the illumination target 50.

Figure 8:
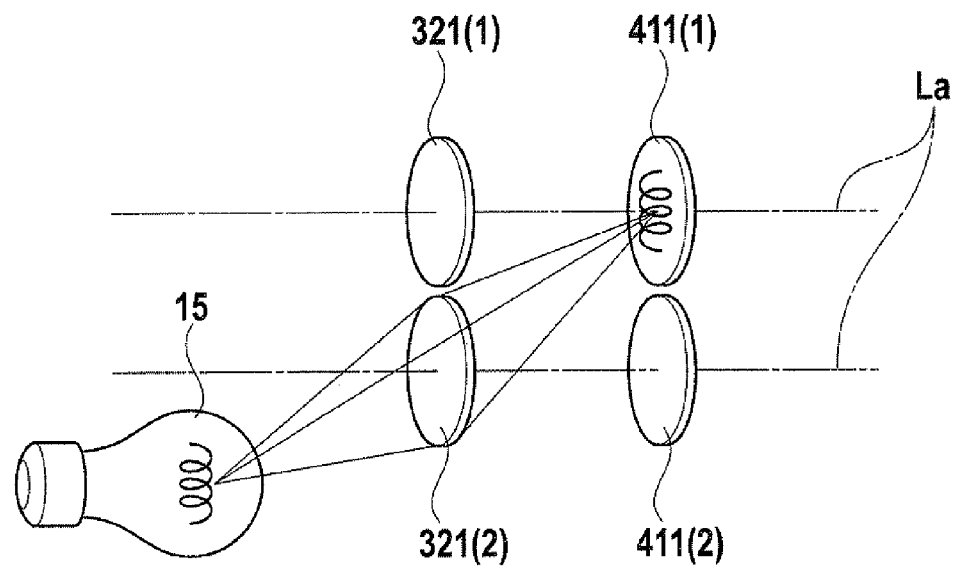
FIG. 8 schematically shows a configuration of a light distribution lens (fly-eye lens) of a comparison example.

In the light distribution control lens realized by the fly-eye lens shown in FIG. 8, if the light source 15 is not present on the optical axis (center axis) La which is common to the first lenticule 321 (2) and the second lenticule 411 (2), the light rays originated from the light source 15 pass through the first lenticules 321 (2) and focus on another second lenticule 411 (1) on the extension of the first and second small lenticules 321 and 411. Such light rays are considered to be of no use. On the contrary, with the light system 1 of the first embodiment, the first lens side 31 (Fresnel lens) is placed between the light source 15 (semiconductor light emitting element 10) and the second lenticules 321 of the second lens side 32. The semiconductor light emitting element 10 is designed so that it seems to be present on the optical axis La which is common to the first lenticules 321(1) and the second lenticule 411(1); and the optical axis La which is common to the first lenticule 321(2) and the second lenticule 411(2). In short, the light rays originated by the semiconductor light emitting element 10 pass through the first lenticules 321 and focuses on the second lenticules 411. This is effective in reducing light loss between the first and second lenticules 321 and 411, and in promoting effective use of the light.

The lighting system 200 (the critical illumination) including the combined total reflection lens 201 differs from the lighting system 1 of the present invention as described hereinafter. For convenience, an ideal optical system is described assuming that a contact lens, capacitor lens, or parallel lens is free from such disturbances as irregular reflection or attenuation, which will be described later. In other words, the lighting system 1 may suffer from reduced use efficiency or light loss resulting from disturbances.

Figure 9:
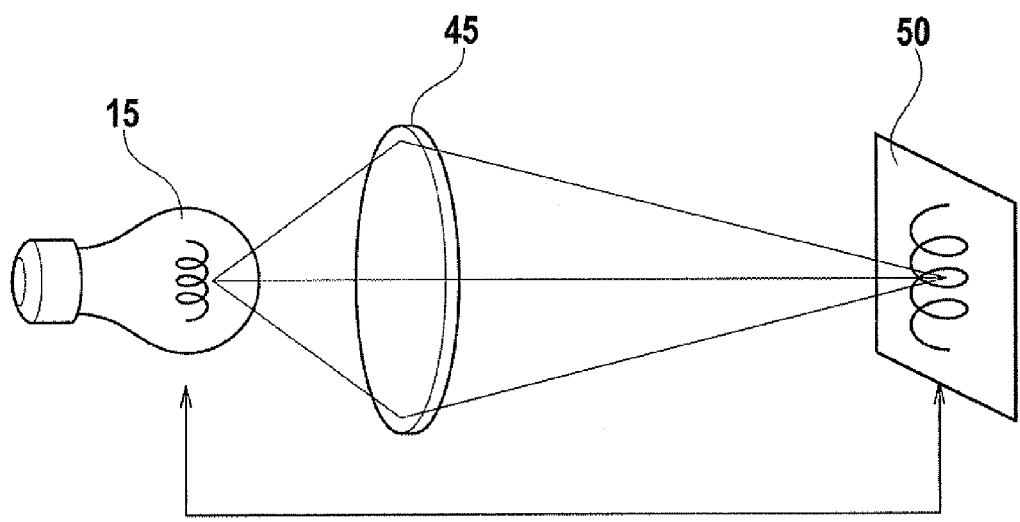
FIG. 9 schematically shows a configuration of lenses of a critical illumination used for a light distribution control lens in the related art.

A critical illumination shown in FIG. 9 includes a light source 15 and an illumination target 50 which are optically conjugate (in image forming relationship). A capacitor lens 45 is placed between the light source 15 and the illumination target 50. If color shades or brightness shades are present on a light emitting surface of the light source 15, similar color shades or brightness shade are also produced on the illumination target 45. The lighting system 200 including the combined total reflection lens 201 and shown in FIG. 26 has a configuration substantially identical to the critical illumination.

Figure 10:
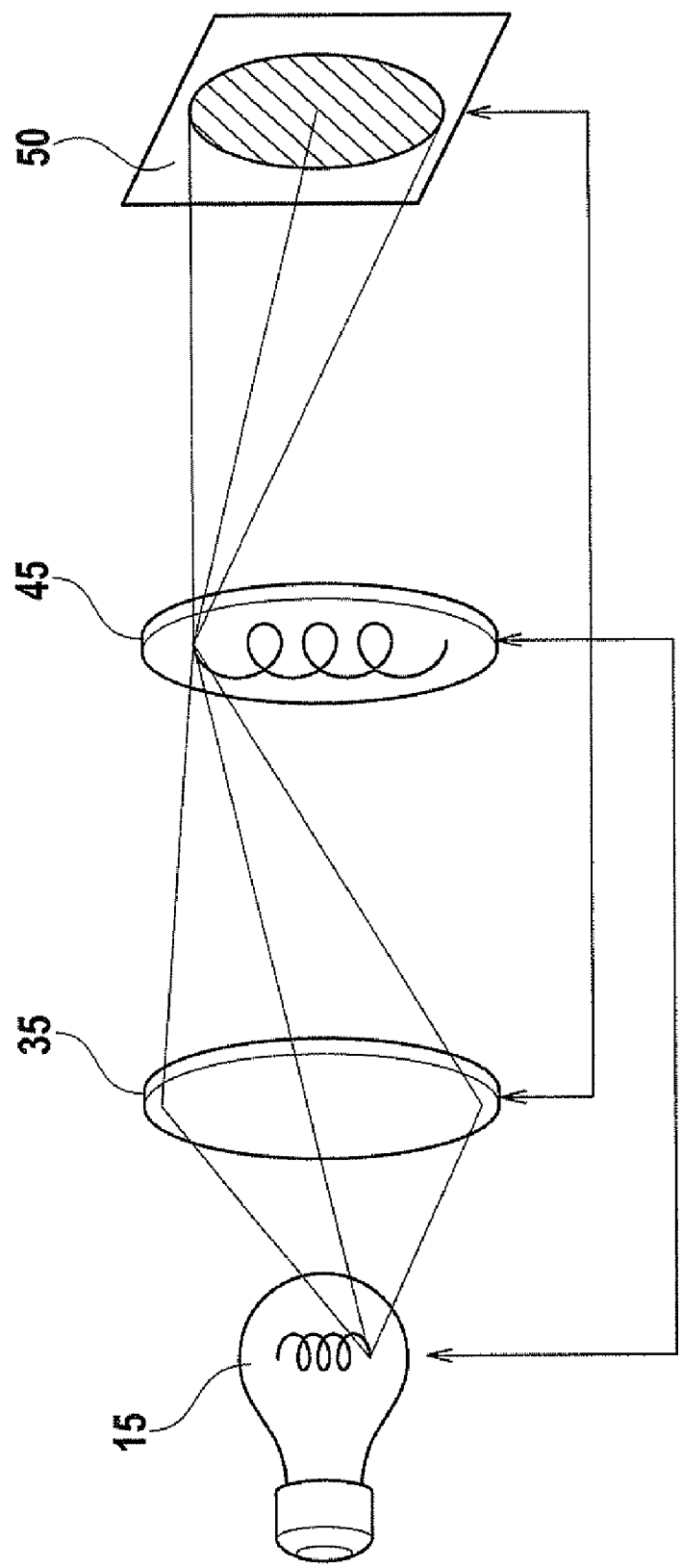
FIG. 10 schematically shows a configuration of lenses in a Kehler illumination used for light distribution control in the lighting system of the first embodiment.

On the contrary, in a Kohler illumination (shown in FIG. 10), a capacitor lens 45 is optically conjugate with a light source 15 while a collector lens 35 is optically conjugate with an illumination target 50. Even if there are color shades or brightness shades at respective light emitting points of the light source 15, usually, direction dependency of colors or brightness changes relatively moderately. The collector lens 35 is relatively uniformly illuminated by the light source 15 so that the collector lens 35 is free from minute color shades. Light rays having luminance distribution in an aperture of the collector lens 35 are projected onto the illumination target 50, so that light rays of the light source 15 are substantially uniformly illuminated onto the illumination target 50. Further, when the collector lens 35 focuses the light rays of the light source 15 in the aperture of the capacitor lens 45, the light rays passing through the collector lens 35 also pass through the capacitor lens 45. This is effective in reducing light loss and promoting effective use of the light.

Figure 11:
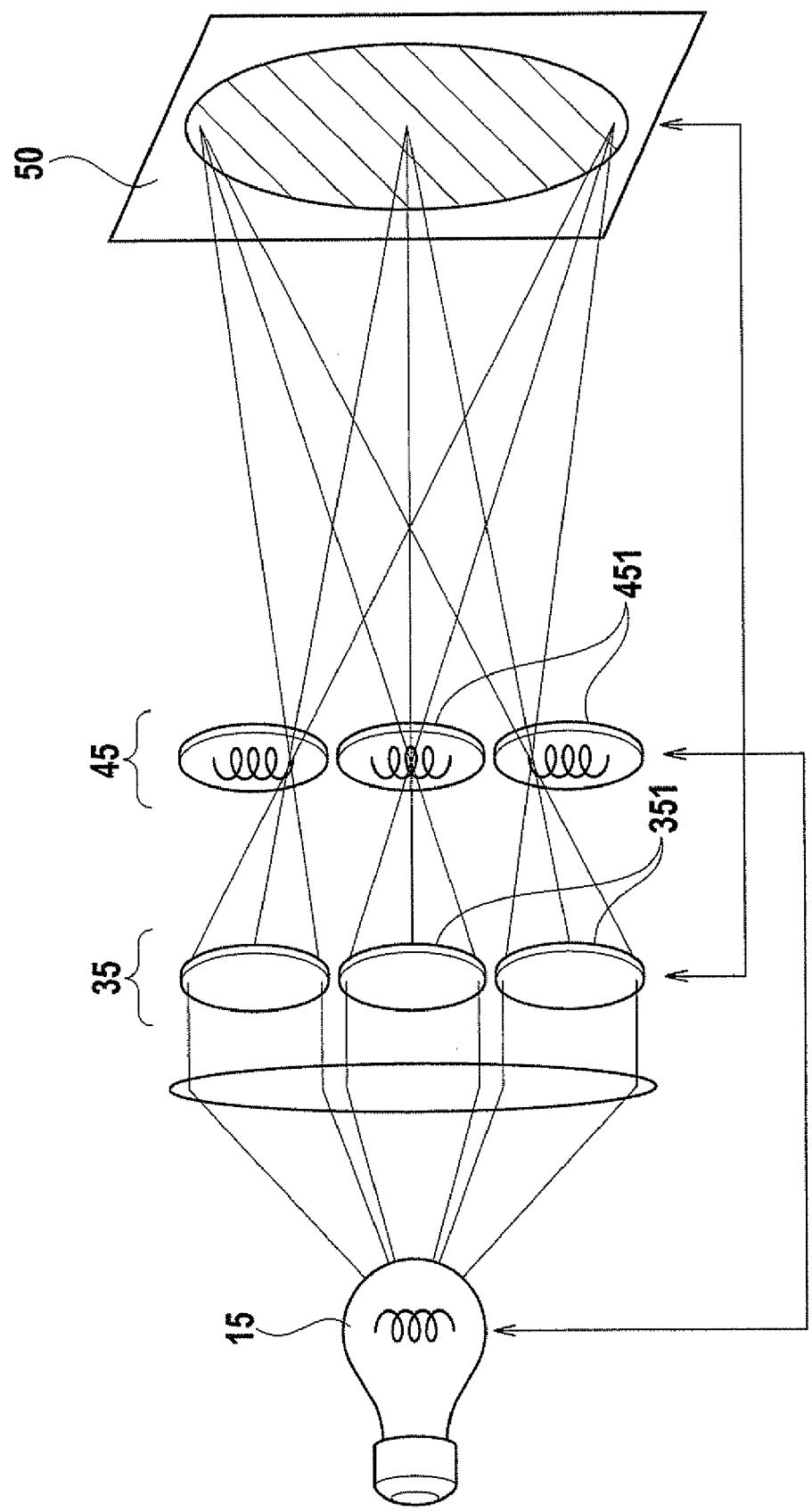
FIG. 11 schematically shows a configuration of lenses in a fly-eye integrator illumination used for light distribution control of the lighting system of the first embodiment.

A further sophisticated Kohler illumination is called "a fly-eye integrator illumination", which is adopted in the first embodiment of the invention. As shown in FIG. 11, each pair of lenticules 351 of the collector lens 35 and lenticules 451 of the collector lens 45 constitute the Kohler illumination. Light rays originated by the light source 15 are refracted and collimated by a collimating lens 36. The collimated light rays are refracted and collected by the lenticules 351, so that the light rays of the light source 15 are focused onto the lenticules 451, and are projected in infinity by the lenticules 451.

A size of an illuminated area of the illumination target 50 is sufficiently large in comparison with the whole size of the lighting system of the fly-eye integrator illumination system. Therefore, areas illuminated in infinity by respective lenticules 451 lap over, so that the same part of the illumination target 50 will be illuminated.

[Advantages of Lighting System]

Figure 12:
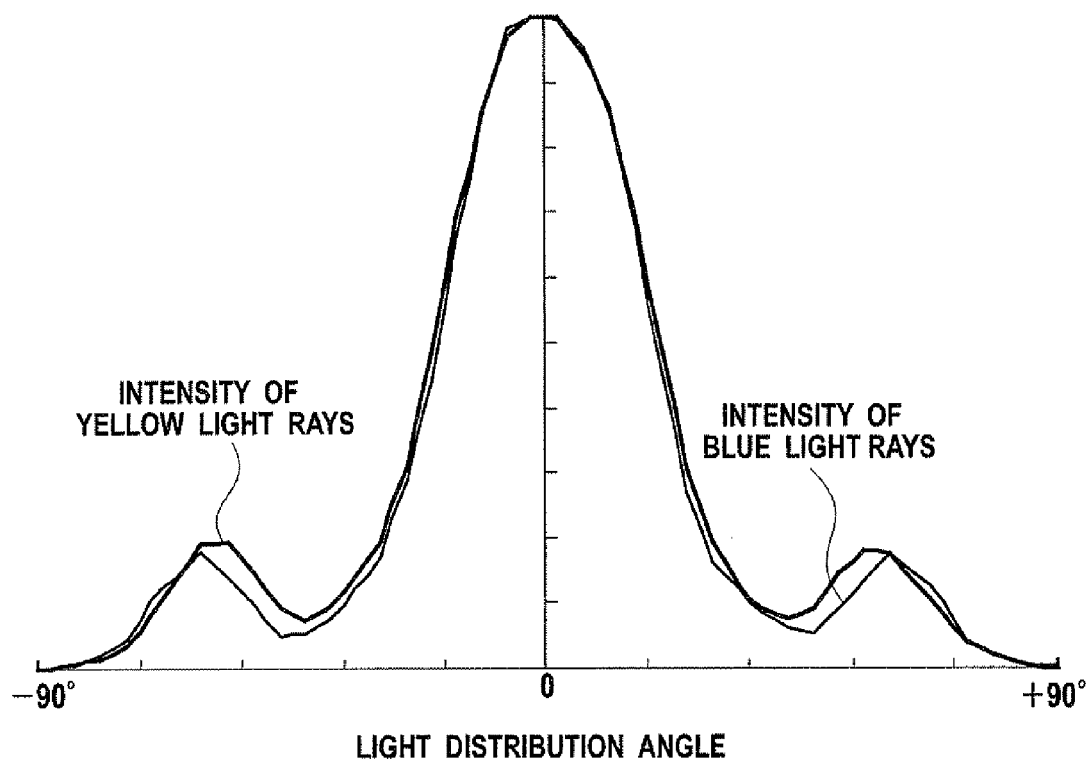
FIG. 12 shows the distribution of light rays in the lighting system of the first embodiment.

FIG. 12 shows the distribution of light rays originated by the lighting system 1. In FIG. 12, the abscissa denotes light distribution angles while the ordinate denotes light intensities. The distribution angles of the blue light rays originated by the semiconductor light emitting element 10 (blue light emitting diode) are substantially the same as those of the yellow light rays originated by the fluorescent object 20 (yellow light emitting substance). In short, the light distributions of the blue and yellow light rays are the same, which enables the lighting system 1 to uniformly illuminate retail and business premises, residences and so on which require a large amount of light.

In the lighting system 1, the first lens side 31 is the Fresnel lens, and the second lens side 32 is the fly-eye lens, which enables the first lens 30 to be in the shape of a thin plate. Further, the third lens side 41 is the fly-eye lens while the fourth lens side 42 is the flat lens, which enables the second lens 40 be in the shape of a thin plate. In short, the light distribution control lenses of the lighting system 1 can be thinned, so that the lighting system 1, especially, the first lens 30 and the second lens 40 can be manufactured at a reduced cost. Further, a plurality of the lighting systems 1 can be arranged to have a modular structure.

It is assumed that the first and second lenses 30 and 40 are made by the injection molding. Plastic lenses are gradually hardened toward centers thereof from surfaces. If the plastic lenses are thin, they will be relatively free from shrinkage or distortion. The plastic lenses are slow to be distorted, and are protected against double refraction. Further, the plastic lenses can be easily molded and easily shaped in a module.

A time period for completely hardening the interior of plastic lenses is approximately proportional to a square of a thickness thereof, for instance. The foregoing combined total reflection lens 201 is thick, and takes time to be hardened. On the contrary, since the first and second lenses 30 and 40 of the lighting system 1 are thin, they can be hardened at short times, which means a shortened time for the injection molding. Therefore, the lighting system 1 can be manufactured at a reduced cost and a shortened time period.

Further, the fourth lens side 42 is flat, is slow to be contaminated, and is easy to be cleaned. This protects the lighting system 1 against contamination such as dust and soil, and prevents reduction of optical efficiency.

SECOND EMBODIMENT

Figure 13:
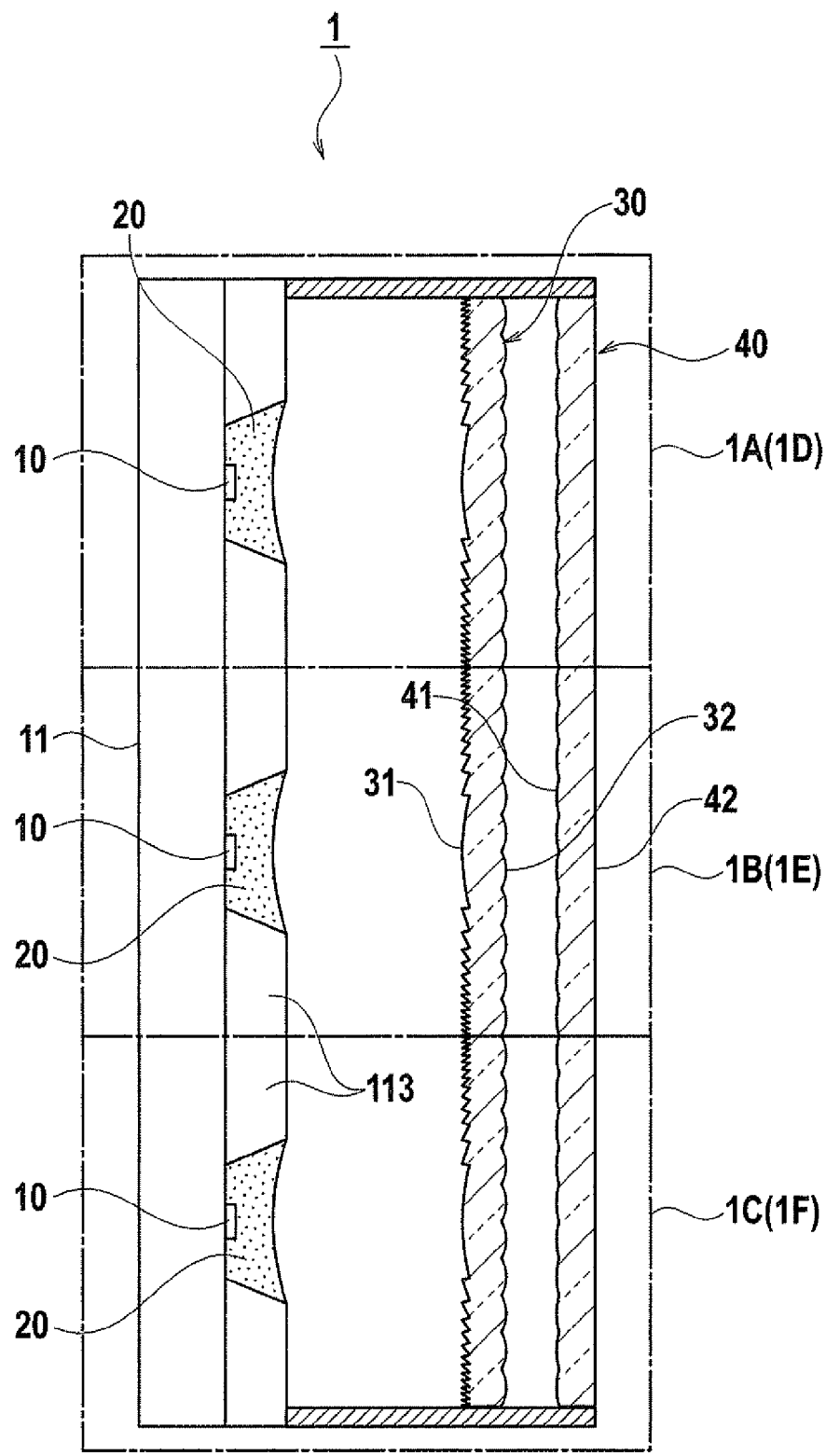
FIG. 13 schematically shows a structure of a lighting system in a second embodiment of the invention.

In a second embodiment, a plurality of lighting systems 1 are assembled to have a module structure. Referring to FIG. 13, each lighting system 1 is constituted by lighting units 1A to 1F, fluorescent objects 20, reflectors 113s, a first lens 30 and a second lens 40. Each of lighting units 1A to 1F includes a semiconductor light emitting element 10. In this embodiment, a total of six lighting units 1A to 1F are arranged in the shape of a matrix. Needless to say, the number of lighting units is not limited but may be determined as desired depending upon an amount of light and application.

Figure 14:
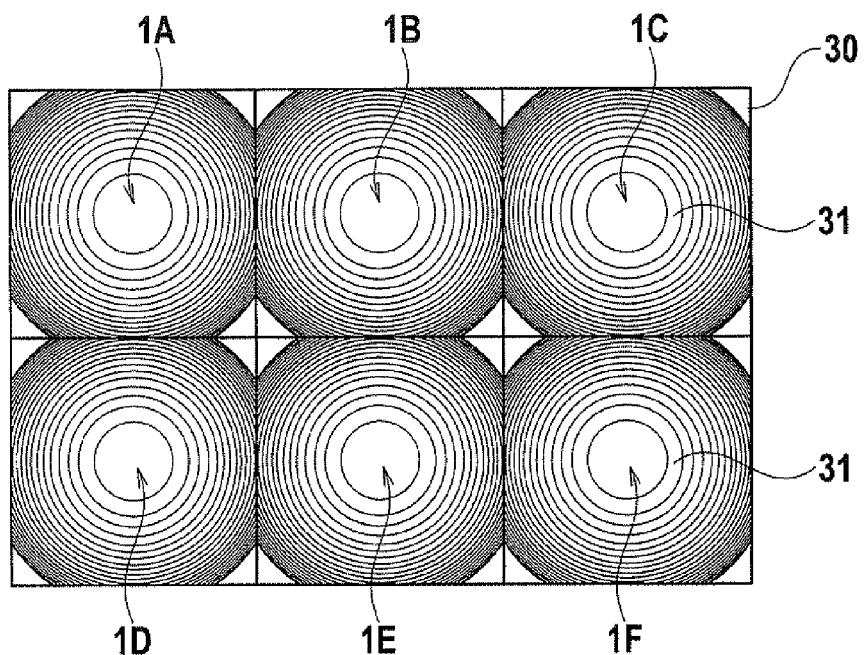
FIG. 14 is a top plan view of a light distribution control lens (Fresnel lens) of the lighting system in FIG. 13.
Figure 15:
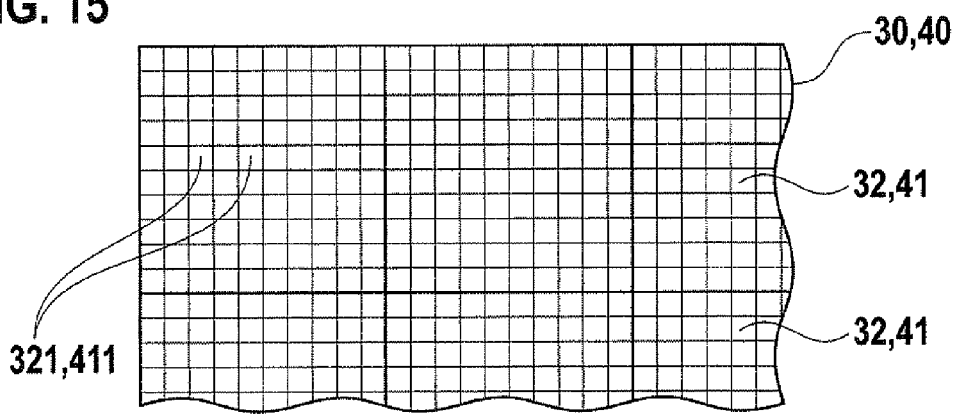
FIG. 15 is a top plan view of a light distribution control lens (fly-eye lens) of the lighting system in FIG. 13.
Figure 16:
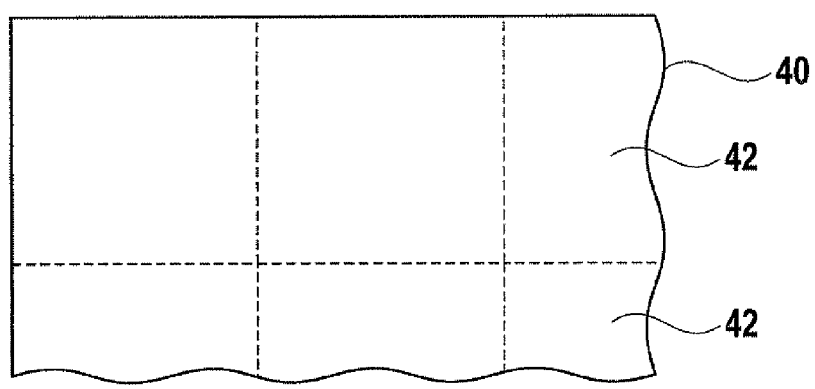
FIG. 16 is a top plan view of a light distribution control lens (flat lens) of the lighting system in FIG. 13.

A substrate 11 is commonly used for the lighting units 1A to 1F. As shown in FIG. 13 to FIG. 15, the first lens 30 having the first lens side 31 (Fresnel lens) and the second lens side 32 (fly-eye lens) are molded as a single piece. Further, as shown in FIGS. 13, 15 and 16, the third lens side 41 (fly-eye lens) and the fourth lens side 42 (flat lens) of the second lens 40 are also molded as a single piece. Since the first and second lenses 30 and 40 are thin, they can be manufactured as a single piece in the lighting units 1A to 1F. The first and second lenses 30 and 40 are attached to and supported by a frame 60 at the periphery of the substrate 11.

According to the second embodiment, the lighting units 1A to 1F can be manufactured as a module depending upon an amount of necessary light in retail or business premises, residences and so on.

THIRD EMBODIMENT

The lighting system 1 of the first or second embodiment is modified in order to promote efficient use of light rays.

[First Configuration of Lighting System]

Figure 17:
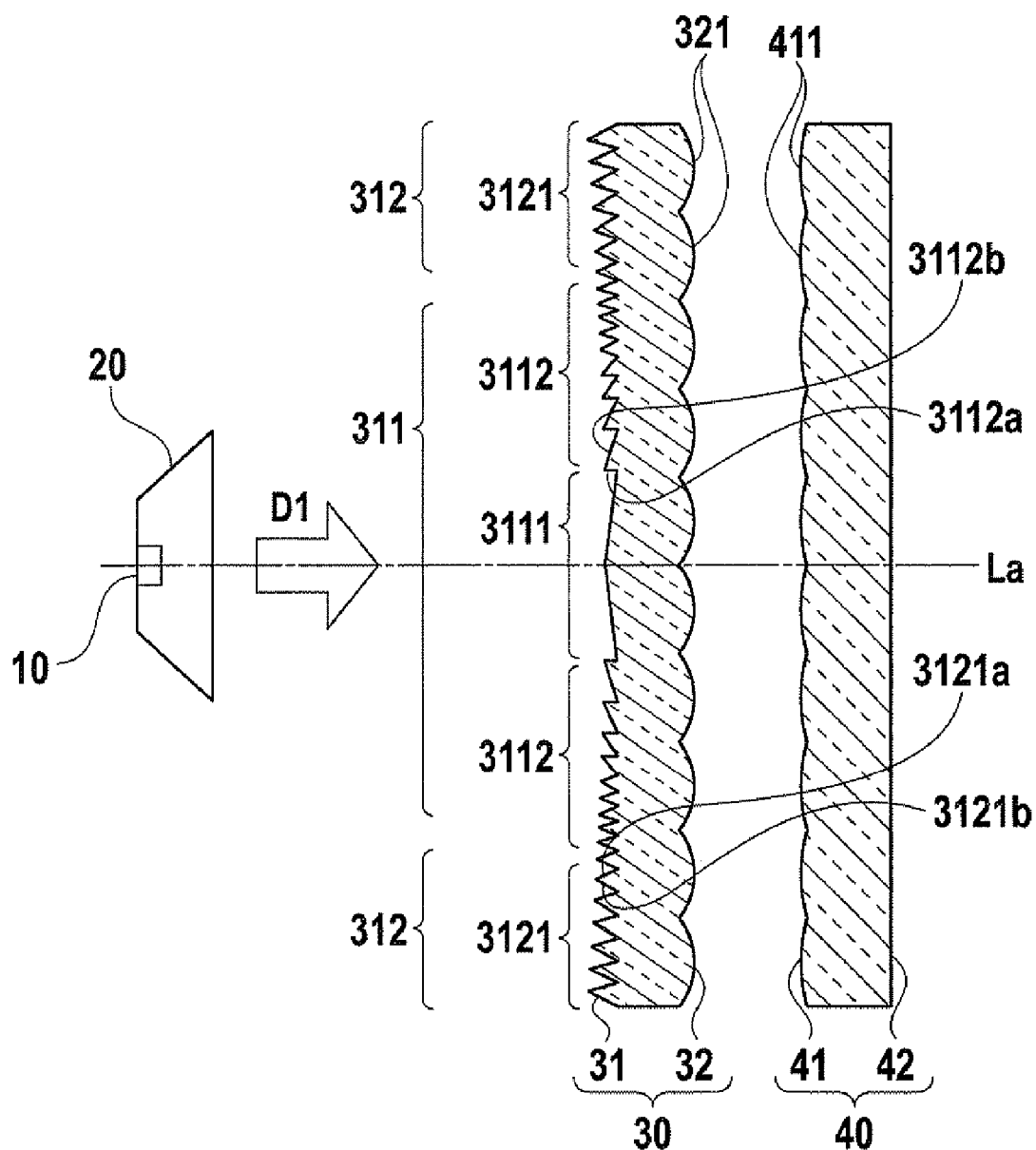
FIG. 17 schematically shows a first structure of a lighting system in a third embodiment of the invention.

Referring to FIG. 17, a lighting system 1 of this embodiment is essentially configured similarly to the lighting system 1 of the first embodiment. The lighting system 1 includes a semiconductor light emitting element 10 (first light source); a fluorescent object 20 (second light source); first lens side 31; second lens side 32; and a third lens side 41. The semiconductor light emitting element 10 originates first light rays. The fluorescent object 20 extends over a light emitting area of the semiconductor light emitting element 10, and originates second light rays in response to the first light rays. A wavelength of the second light rays differs from that of the first light rays. The first lens side 31 includes a refractive region 311 for refracting and collimating the first and second light rays, and a reflective region 312 for reflecting and collimating the first and second light rays. The second lens side 32 is constituted by a plurality of first lenticules 321 which refract and reflect the first and second light rays, and are juxtaposed. The third lens side 41 carries on its surface a plurality of second lenticules 411, and refracts the first and second light rays which have been refracted by the second lens side 32. The first lenticules 321 and the second lenticules 411 correspond to one another on the one-to-one basis. The first lenticules 321 collect the first and second light rays onto the second lenticules 411. A part of light rays refracted by one of the first lenticules 321 and one of the second lenticules 411 overlaps one another with the second illumination area 52 of the first and second light rays refracted by another first lenticule 321 and another second small lens side 411 (refer to FIG. 1). The first and second light rays originated by the lighting system 1 are focused in infinity onto the illumination target 50, which is the first illumination area 51 and the second illumination area 52.

In the first lens side 31 of the first lens 30, the refractive region 311 is positioned on the center of the optical axis La of the first and second light rays. The reflective region 312 using the total reflection is placed around the refractive region 311. The refractive region 311 includes a round part 3111, and a first continuous prism 3112. The round part 3111 is at the center and around the optical axis La, and extends toward the semiconductor light emitting element 10 and the fluorescent object 20. The first continuous prism face 3112 includes stepped concentric circles 3112a and refractive surfaces 3112b. Each refractive surface 3112b is positioned around the round part 3111, and refracts the first and second light rays across the optical axis La (i.e., vertically). The refractive surfaces 3112b and the stepped concentric circles 3112a are alternately arranged.

The round part 3111 of the refractive region 311 forms an angle θ between the optical axis La and the first and second light rays from the light sources (the light emitting element 10 and the fluorescent object 20). The angle θ is 10 degrees or smaller, for instance. The round part 3111 is positioned in a range whose angle is nearly equal to an angle of collimated light rays. In the first configuration, the round part 3111 is in the shape of a cone whose apex angle is 150 degrees to 180 degrees.

Figure 18:
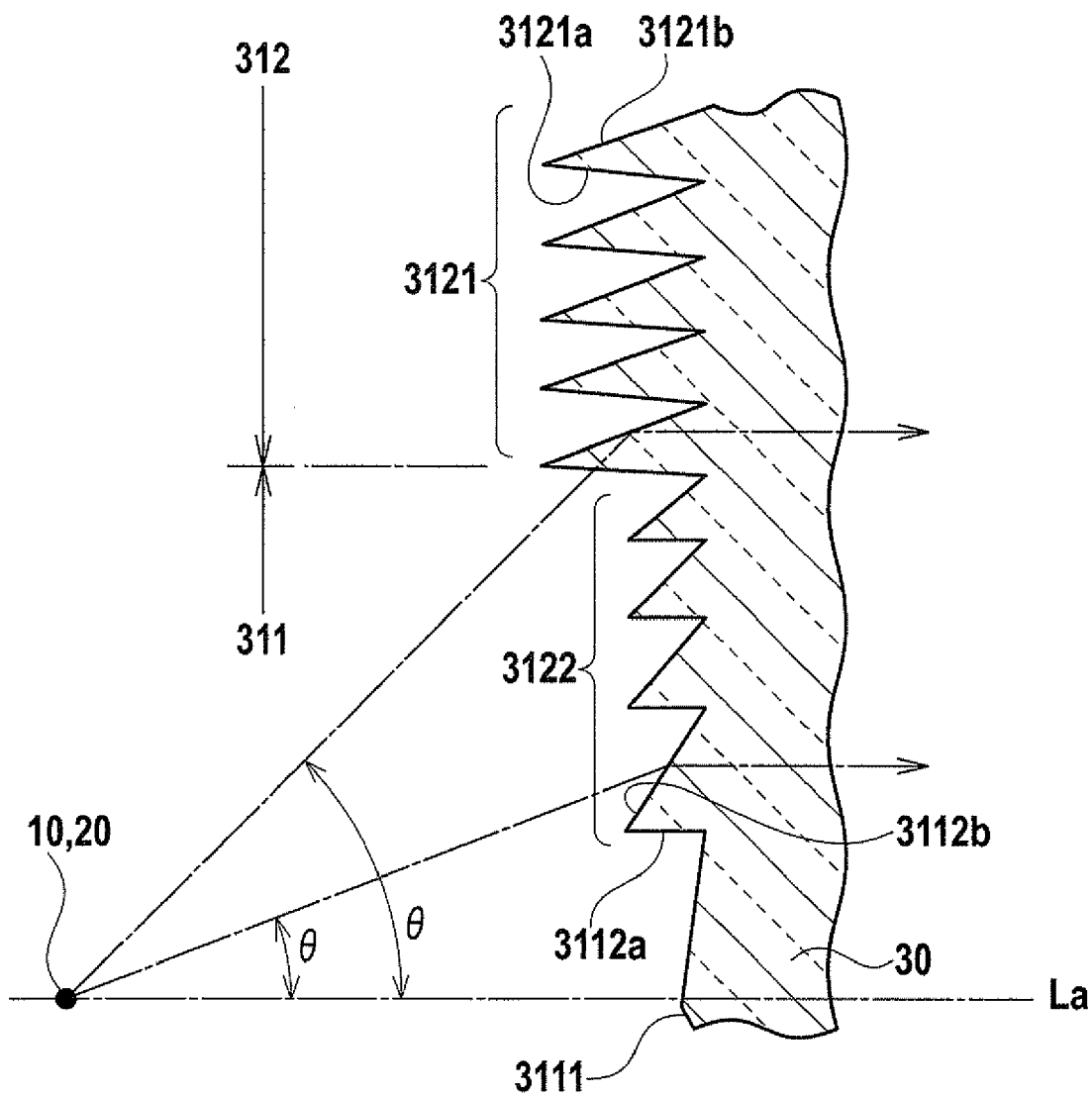
FIG. 18 is an enlarged view of an essential part of the lighting system shown in FIG. 17.

The first continuous prism face 3112 is a Fresnel lens. As shown in FIG. 18, the refractive surfaces 3112b of the first continuous prism face 3112 forms an angle of 30 degrees or smaller with respect to the optical axis La around the light sources. In short, the first and second light rays from the light sources reach the refractive surfaces 3112b, and are collimated. The stepped concentric circles 3112a are brought in line with the optical axis La according to the principle shown in FIG. 5.

Figure 19:
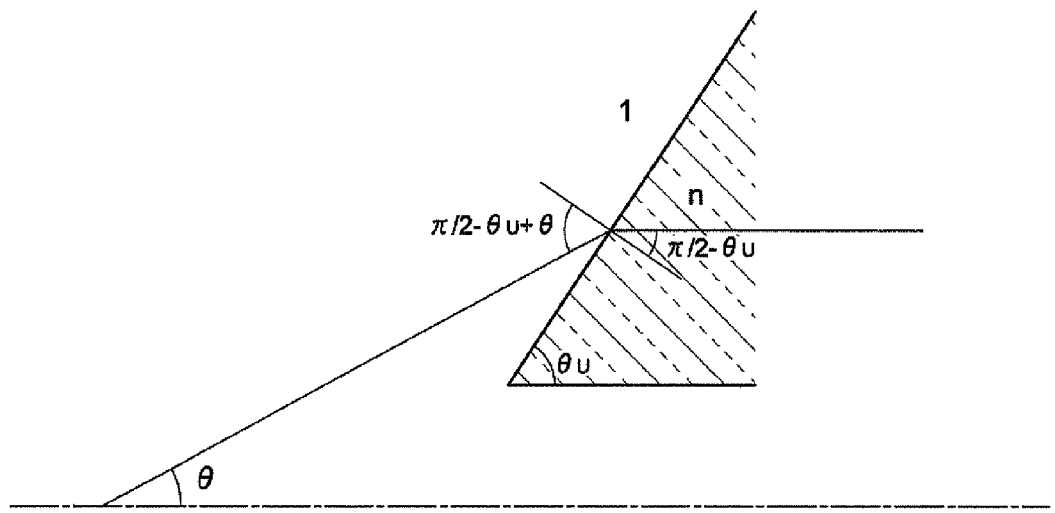
FIG. 19 shows the relationship between an angle of light rays of a refractive Fresnel collimator and an inclination angle of a lens.

As shown in FIG. 19, the refractive surfaces 3112b are inclined with an angle $\theta_U$, which is ideally determined to satisfy the following, where θ denotes the angle between the light rays from the light sources to the refractive surfaces 3112b and the optical axis, and n denotes a refractive index of a lens.

$$\theta_U = \tan^{-1}\left(\frac{n - \cos\theta}{\sin\theta}\right) \quad (1)$$

On the contrary, in order to efficiently use the first and second light rays originated by the light source at an angle of 30 degrees or larger, the reflective region 312 includes a second continuous prism 3121 constituted by incident sides 3121a receiving the first and the second light rays, and reflective side 3121b reflecting the incident first and second light rays. The incident sides 3121a and the reflective sides 3121b are alternately arranged. The second continuous prism 3121 is a Fresnel lens. The incident sides 3121a receive the first and second light rays from the light source, and are slightly sloped toward the refractive region 311. The reflective sides 3121b are inclined by 30 degrees or larger, and collimate the first and second light rays passing through the incident sides 3121a. The reflective sides 3121b are of the total reflection type.

Figure 20:
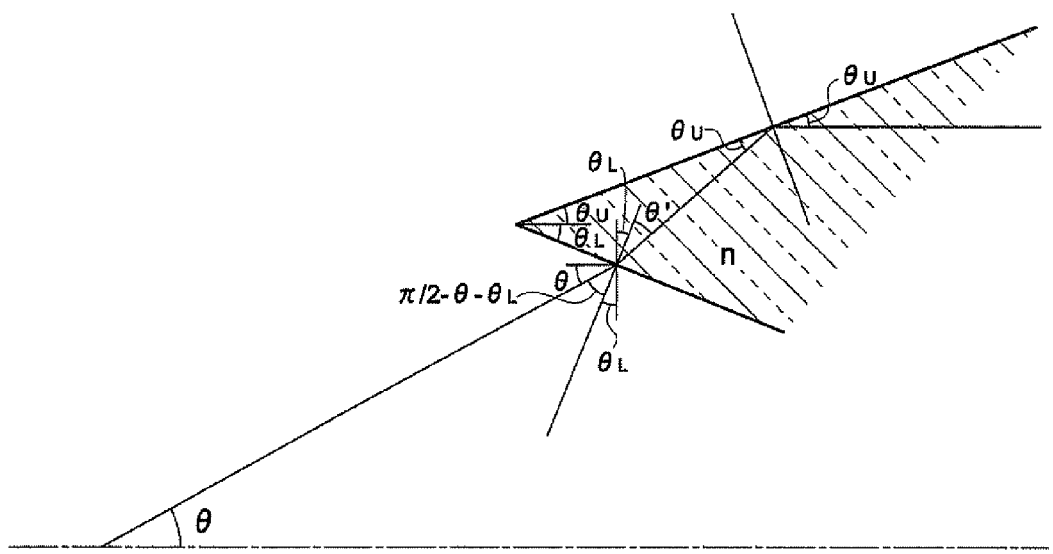
FIG. 20 shows the relationship between an incident angle of a full reflection type Fresnel collimator and an inclination angle of a lens.

As described above, the first and second light rays from the light sources are received in and refracted by the incident sides 3121a, are then totally reflected by the reflective sides 3121b, and are substantially collimated. As shown in FIG. 20, the inclination angle $\theta_L$ between the incident sides 3121a and the reflective sides 3121b, and $\theta_U$ are preferably determined to satisfy the following with respect to the angle θ between the light rays from the center of the light sources and the incident sides 3121a and the optical axis La.

$$\cos(\theta + \theta_L) = n \cos(2\theta_U + \theta_L) \quad (2)$$

The refracted first and second light rays can be collimated and become parallel to the optical axis La.

The term "total reflection" is defined as follows. When passing through two transparent media having two different refraction factors, light rays are refracted at a border between the media. For instance, it is assumed here that one medium has a refractor factor n1 while the other medium has a refraction factor n2 (i.e., n1>n2) and light rays reach the border at an incident angle θ. When the incident angle θ is small (i.e., θ is smaller than a critical angle), the light rays are refracted at the border and go forward. The larger the incident angle θ, the nearer the refracting angle becomes 90 degrees. When sin θ=n2/n1, the refracting angle becomes equal to 90 degrees. In this state, the incident angle is equal to the critical angle. Further, if the incident angle θ is larger than the critical angle, the light rays are completely reflected at the border. This phenomenon is called the "total reflection". In the third embodiment, since air having the refraction factor "1" is used as a medium in order to attain the refraction factor n2, sin θ=1/n1 in the foregoing condition expression.

Figure 21:
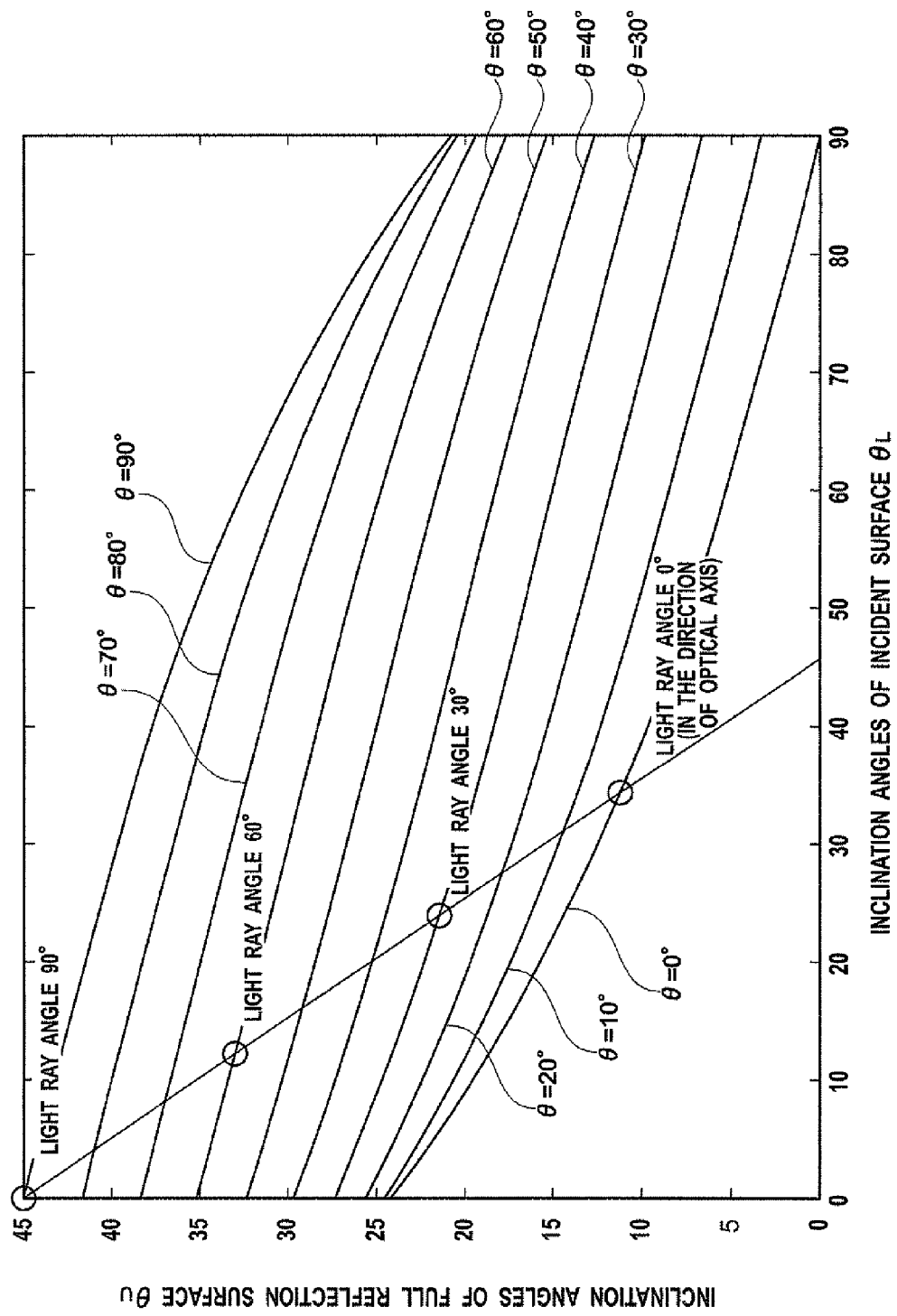
FIG. 21 shows characteristic curves for determining angles of the full reflection type Fresnel lens when a byte angle is constant.

The apex angles of the incident sides 3121a and the reflective sides 3121b of the second continuous prism 3121 of the reflective region 312 are the same. FIG. 21 shows the relationship expressed by the formula (2).

A number of curves are depicted in FIG. 21 in accordance with incident angles of light rays. As can be seen from the graph of FIG. 21, $\theta_U$ and $\theta_L$ cannot be uniquely determined only when θ and "n" are known. This is because one parameter remain unknown. When a byte angle is assumed to be a given value, i.e., $\theta_U + \theta_L$=constant, is added, $\theta_U$ and $\theta_L$ can be uniquely determined. In FIG. 21, a straight line $\theta_U + \theta_L$=45° is added. $\theta_U$ and $\theta_L$ can be determined on the basis of a cross point of a curve related to a certain θ and the byte angle 45°. If $\theta_U + \theta_L$ is between 0° and 90°, a solution for any θ is available. Therefore, the byte angle can be any value between 0° and 90°.

In the reflective region 312, apex angles formed by the incident sides 3121a and reflective sides 3121b of the second continuous prism 3121 are equal. A lowest point (which is formed by each refractive side 3112a and each reflective face 3112b of the first continuous prism 3112 of the refractive region 311) and another lowest point (which is formed by the refractive side 3112b of the stepped concentric circle 3112a of the second continuous prism 3121 of the reflecting region 312) are present on the same plane (that is perpendicular to the optical axis La).

The first lens 30 can be easily fabricated when it is cut around the optical axis La using and rotating one expensive diamond cutter. In this case, either the first lens 30 or the diamond cutter may be relatively rotated. For instance, the diamond cutter preferably has triangular blades in order to shave off one incident side 3121a and one reflecting side 3121b of the second continuous prism 3121. Further, the diamond cutter is also used to make the round part 3111 of the refractive region 311 and the continuous prism 3112.

Further, in the first lens 30, the round part 3111, the first continuous prism 3112 and the second continuous prism 3121 have straight cross sections, so that they can be fabricated by the injection molding and using molds which area easily prepared.

The lighting system 1 of the third embodiment is as effective and advantageous as the lighting system 1 of the first embodiment. Further, the refractive region 311 and the reflective region 312 are placed on the first lens side 31, so that the first and second light rays which are present around the first lens side 31 and are not refracted by the Fresnel lens can be reflected and collimated. This is effective in promoting efficient use of the light rays around the first lens side 31.

[Second Configuration of Lighting System]

Figure 22:
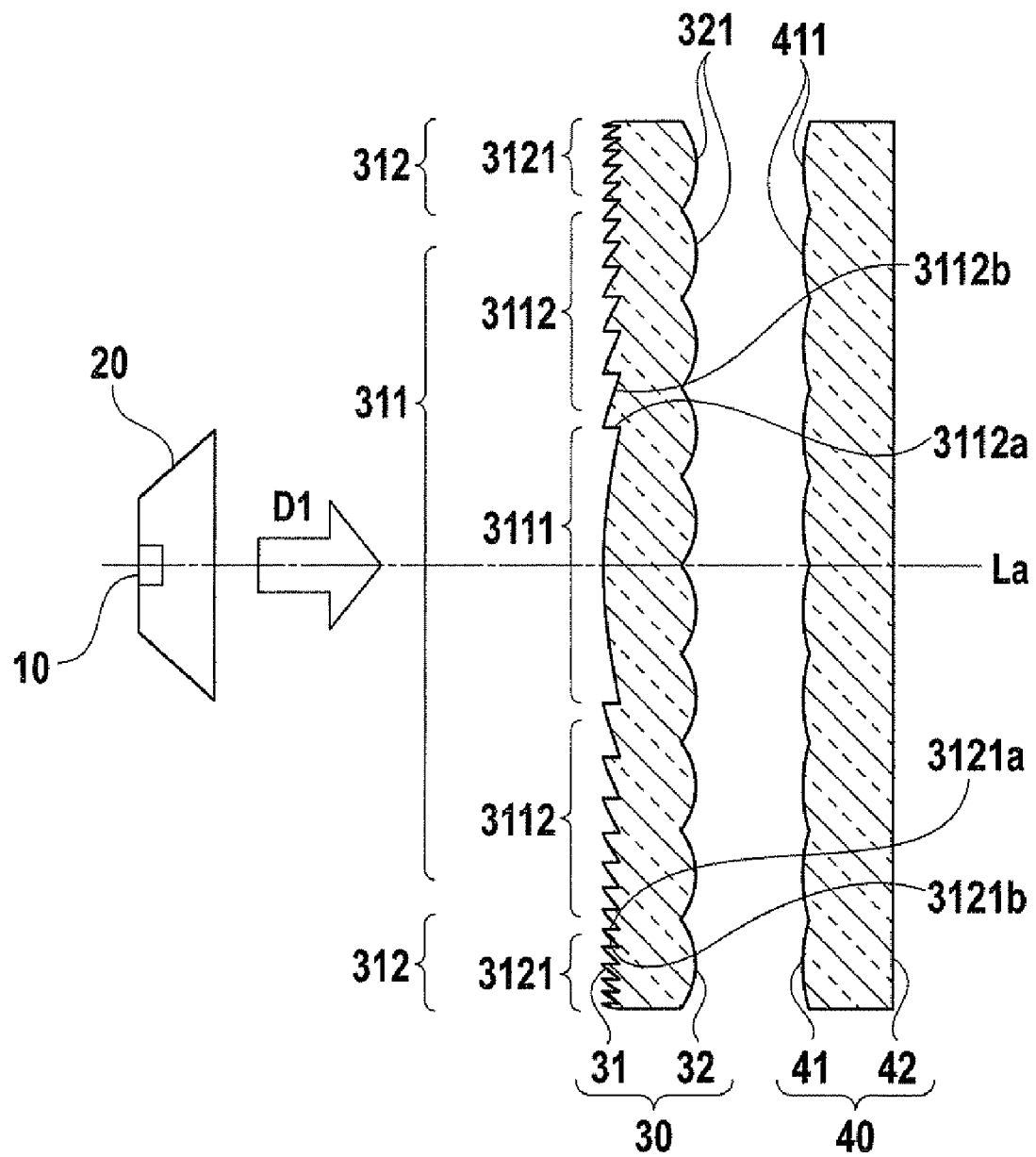
FIG. 22 schematically shows a second structure of the lighting system in the third embodiment.

In the lighting system 1 of the third embodiment, the round part 3111 of the refractive region 311 may be curved on the first lens side 31 toward the light source like convex lenses. Refer to FIG. 22. An apex of the refractive face 3112b and the stepped concentric circle 3112a of the first continuous prism 3112 and an apex of the incident side 3121a and the reflecting side 3121b of the second continuous prism 3121 may be present on the same plane. A mold for injection molding can be easily made.

The lighting system 1 having the second configuration is as efficient and advantage as the lighting system 1 having the first configuration.

[Third Configuration of Lighting System]

Figure 23:
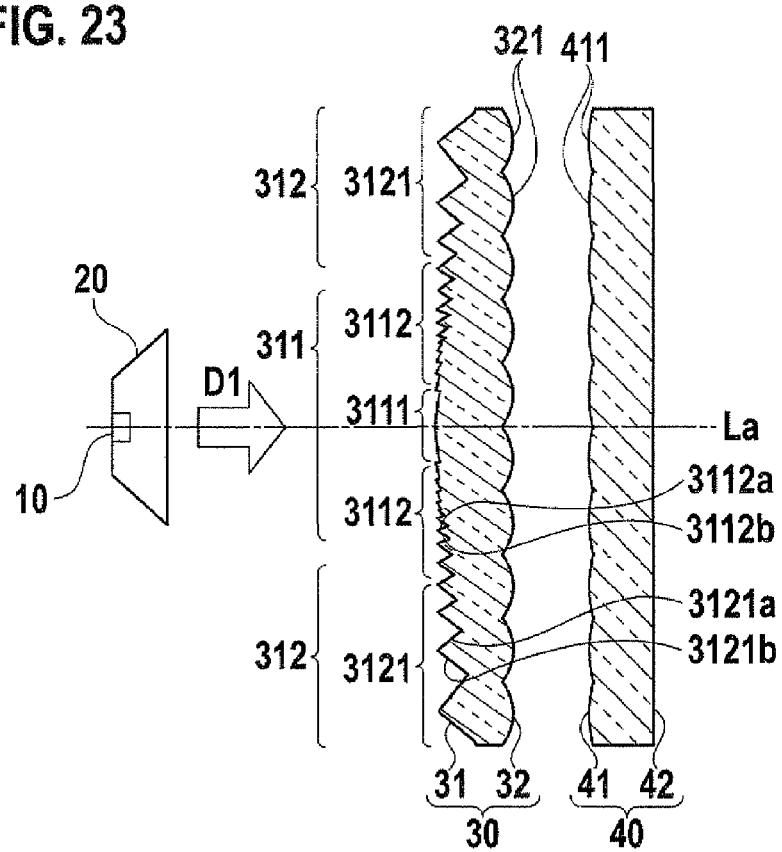
FIG. 23 schematically shows a third structure of the lighting system in the third embodiment.

The lighting system 1 of the third embodiment may be modified as shown in FIG. 23. On the first lens side 31 of the first lens 30, the highest point (position of an apex angle) formed by the refractive side 3112b and the stepped concentric circle 3112a of the first continuous prism 3112, and the highest point formed by the incident side 3121a and the reflective face 312 of the second continues prism 3121 may be on the same plane. Further, a distance between the highest points and lowest points may be gradually increased. In this case, an area of the incident side 3121a and incident angles can be gradually and centrifugally increased, which is effective in promoting efficient use of light rays.

The lighting system 1 having the third configuration is as effective and advantageous as the lighting system having the first configuration.

In the foregoing lighting system 1, the round part 3111 of the refractive region 311 may be flattened so long as light rays can be collimated.

FOURTH EMBODIMENT

The lighting systems 1 of the first to third embodiments may be modified in order to further promote efficient use of light rays.

Figure 24B:
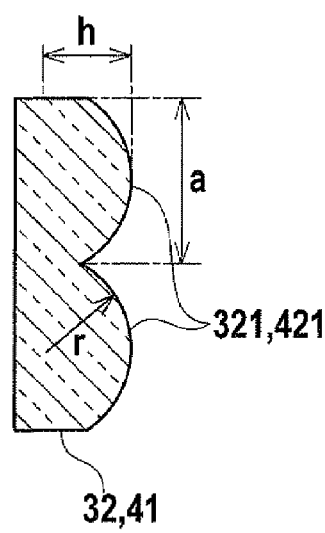
FIG. 24B is a cross section of the light distribution control lens, taken along line 21B-21B in FIG. 24A.
Figure 24A:
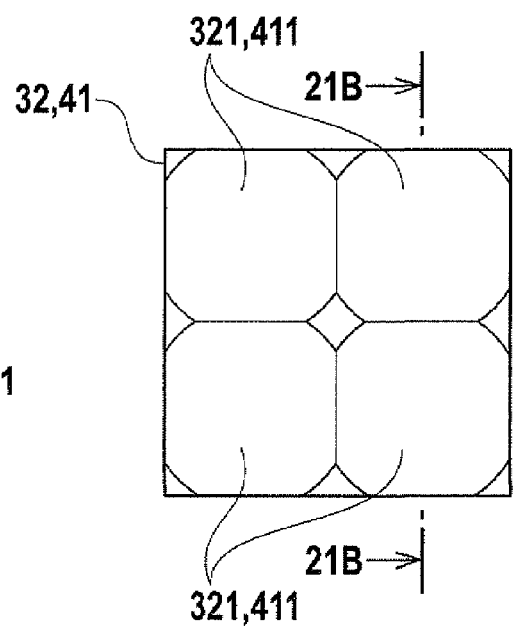
FIG. 24A is a top plan view of an essential part of a light distribution control lens of a lighting system in a fourth embodiment of the invention.
Figure 25:
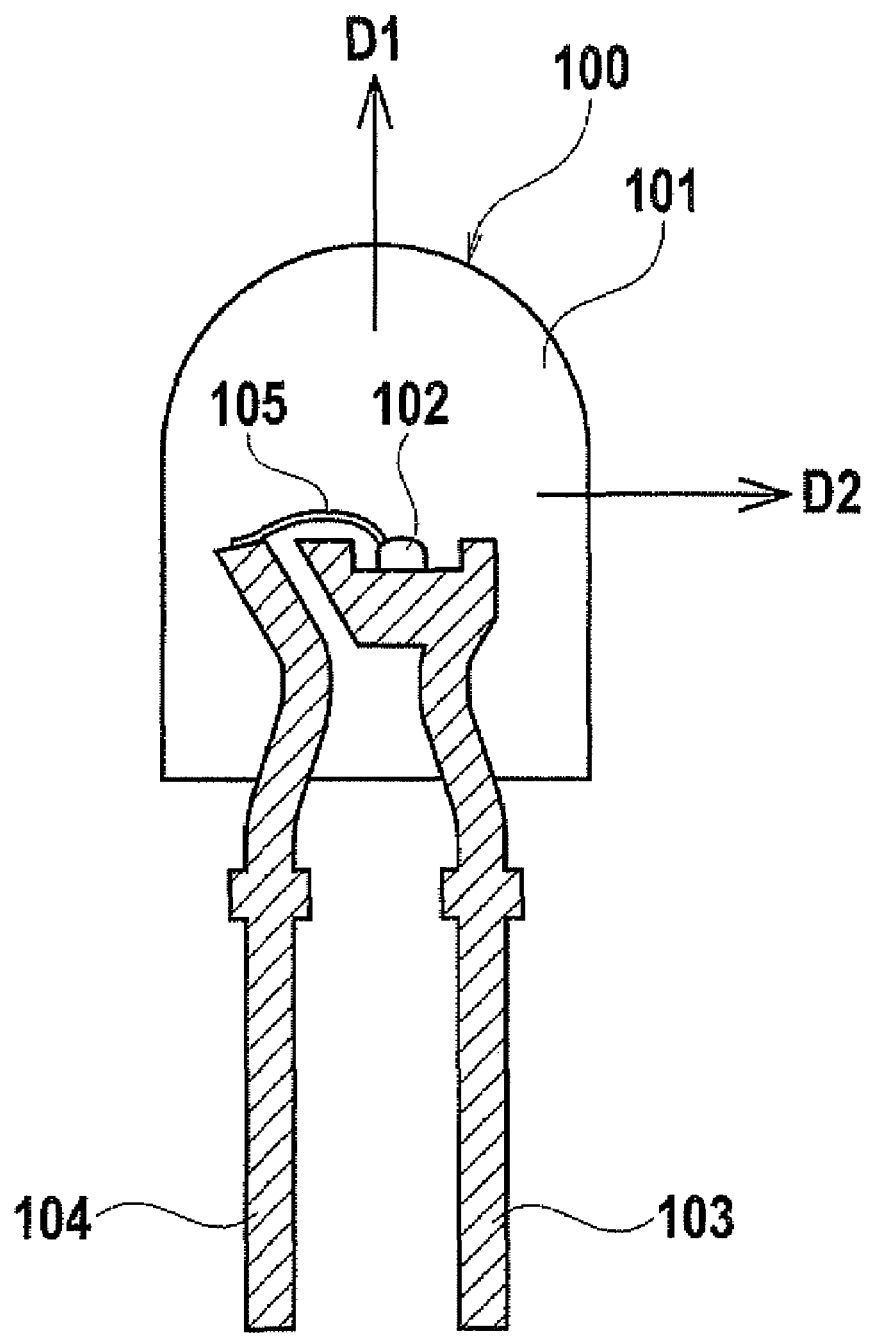
FIG. 25 shows a structure of a lighting system having a bombshell-shaped lens in an example of the related art.

In a lighting system 1 of this embodiment, first lenticules 321 of the second lens side 32 (fly-eye lens) of the first lens 30 or second lenticules 411 of the third lens face 41 (fly-eye lens) of the second lens 40 are more closely arranged as shown in FIG. 24A and FIG. 24B. Specifically, on the second lens side 32, dead spaces (flat spaces) between the first lenticules lenses 321 are minimized so that they can be packed. The second lenticules 411 are packed similarly to the first lenticules 321. The more densely the first lenticules 321 are packed, the more efficiently light rays can be utilized. The same holds true to the second lenticules 411.

The second lens side 32 and the third lens side 41 are fabricated so as to satisfy the following formula, where "a" denotes pitches between the lenticules (fly-eye lens), "r" denotes a curvature radius of the fly-eye lens, and "h" denotes a height of the fly-eye lens.

$$r - \sqrt{r^2 - \left(\frac{\sqrt{2}}{2}a\right)^2} < h < r \qquad (3)$$

In the lighting system 1 of the fourth embodiment, the first lenticules 321 of the second lens side 32 and the second lenticules 411 of the third lens side 41 can be very closely arranged, which is effective in promoting efficient use of light rays.

OTHER EMBODIMENTS

While the invention herein disclosed has been described by means of specific embodiments and applications thereof, numerous modifications and variations could be made hereto by those skilled in the art without departing from the scope of the invention.

For instance, the semiconductor light emitting element 10 of the lighting system 1 is the blue light emitting diode in the foregoing embodiments. Alternatively, a plurality of light sources whose light emitting points are different may be used in combination, e.g., green light emitting diodes and blue light emitting diodes may be used in order to produce white light rays. A semiconductor laser may be used in place of the semiconductor light emitting element 10.

The first lenticules 321 and the second lenticules 411 are convex lenses in the foregoing embodiments. Alternatively, both or either the first lenticules 321 or the second lenticules 411 may be Fresnel lenses. Specifically, the first lenticules 321 may be Fresnel lenses while the second lenticules 411 may be convex lenses. In this case, the first lenses 30 can be made thinner, which is effective in improving yield, reducing a manufacturing cost, and shortening a manufacturing period.

The first lens side 31 is a simple Fresnel lens in the lighting system 1 of the foregoing embodiments. Alternatively, a complicated Fresnel lens may be utilized. Further, a Fresnel lens in which stepped concentric circles are independently designed may be used as the first lens side 31.

Further, two or more lighting systems 1 of the first to fourth embodiments may be used in combination.

What is claimed is:

1. A lighting system comprising:
   a first light source emitting first light rays;
   a second light source having a light emitting point partly displaced from the first light source and emitting second light rays whose wavelength differs from a wavelength of the first light rays;
   a first lens including a first lens side facing the first and second light sources, and a second lens side being opposite to the first lens side, the first lens side which refracts and collimates the first and second light rays, the second lens side which includes a plurality of juxtaposed first lenticules and refracts the first and second light rays collimated by the first lens side; and a second lens including a third lens side facing the second lens side, the third lens side which includes a plurality of juxtaposed second lenticules and refracts the first and second light rays refracted by the second lens side, wherein each of the first lenticules has a convex surface curved outward toward the third lens side; each of the second lenticules has a convex surface curved outward toward the second lens side; each of the second lenticules correspond to each of the first lenticules on a one-to-one basis; the first lenticules collect the first and second light rays on the corresponding second lenticules, respectively; and a part of a first illumination area of the first and second light rays refracted by one of the first lenticules and one of the second lenticules overlaps with a part of a second illumination area of the first and second light rays refracted by another one of the first lenticules and another one of the second lenticules.

2. The lighting system defined in claim 1, wherein the first light source is a semiconductor light emitting element: and the second light source is a fluorescent object which extends over a first light emitting area of the semiconductor light emitting element, and emits fluorescent light in response to the first light ray.

3. The light system defined in claim 2, wherein the first lens side is curved outward toward the semiconductor light emitting element.

4. The lighting system defined in claim 2, wherein the first lens side is a Fresnel lens which is curved outward toward the semiconductor light emitting element.

5. The lighting system defined in claim 1, wherein the first lens side is a Fresnel lens; and the second lens side is a fly-eye lens.

6. The lighting system defined in claim 1, wherein the first lens side is a Fresnel lens; and the third lens side is as a fly-eye lens.

7. The lighting system defined in claim 2, wherein the semiconductor light emitting element emits the first light rays whose wavelength is equal to a wavelength of blue light rays.

8. The lighting system defined in claim 2, wherein the fluorescent object emits the second light rays which are yellow or whose wavelength is equal to a combination of wavelengths of yellow and red light rays.

* * * * *